United States Patent
Dolan

(10) Patent No.: US 11,734,472 B2
(45) Date of Patent: Aug. 22, 2023

(54) SYSTEM AND METHOD FOR MODELING PHYSICAL OBJECTS IN A SIMULATION

(71) Applicant: Zoox, Inc., Foster City, CA (US)

(72) Inventor: James Graham Dolan, Foster City, CA (US)

(73) Assignee: Zoox, Inc., Foster City, CA (US)

( * ) Notice: Subject to any disclaimer, the term of this patent is extended or adjusted under 35 U.S.C. 154(b) by 1067 days.

(21) Appl. No.: 16/213,937

(22) Filed: Dec. 7, 2018

(65) Prior Publication Data
US 2020/0184027 A1 Jun. 11, 2020

(51) Int. Cl.
| G06N 20/20 | (2019.01) |
| G06N 20/10 | (2019.01) |
| G06F 30/20 | (2020.01) |
| G01S 17/89 | (2020.01) |
| G06N 20/00 | (2019.01) |
| G01S 13/89 | (2006.01) |
| G06F 30/15 | (2020.01) |
| H04N 23/90 | (2023.01) |

(52) U.S. Cl.
CPC .......... G06F 30/20 (2020.01); G01S 13/89 (2013.01); G01S 17/89 (2013.01); G06N 20/00 (2019.01); *G06F 30/15* (2020.01); *H04N 23/90* (2023.01)

(58) Field of Classification Search
CPC .......... G06F 30/27; G06F 30/20; G06N 20/00
See application file for complete search history.

(56) References Cited

U.S. PATENT DOCUMENTS

| 8,243,064 | B1 * | 8/2012 | Moravanszky | ......... G06F 30/20 |
| | | | | 345/473 |
| 10,664,750 | B2 * | 5/2020 | Greene | ................. G06V 20/188 |
| 10,983,199 | B2 | 4/2021 | Adams et al. | |
| 11,175,132 | B2 | 11/2021 | Adams et al. | |
| 2017/0177954 | A1 * | 6/2017 | Micks | ...................... G06T 7/251 |
| 2017/0278303 | A1 | 9/2017 | Groh et al. | |
| 2018/0329411 | A1 | 11/2018 | Levinson et al. | |
| 2020/0349362 | A1 * | 11/2020 | Maloney | ................... G06T 7/70 |

FOREIGN PATENT DOCUMENTS

WO 2018002910 A1 1/2018

OTHER PUBLICATIONS

International Search Report and Written Opinion dated Mar. 5, 2020, Patent Application No. PCT/US2019/064330, 10 pages.

\* cited by examiner

*Primary Examiner* — Hsiungfei Peng
*Assistant Examiner* — Fred Peng
(74) *Attorney, Agent, or Firm* — Davis Wright Tremaine LLP

(57) ABSTRACT

An object model for a real-world object is constructed using a parameter-based object generator, where the parameters for the object model are determined using sensor data such as photographic images, radar images, or LIDAR images obtained from the real-world object. Conversion of the sensor data to appropriate object parameters is accomplished using a machine learning system. The machine learning system is calibrated by generating a plurality of object parameters, generating a corresponding plurality of learning objects from the plurality of object parameters, generating a plurality of simulated sensor return data for the learning objects, and then providing the simulated sensor return data and object parameters to the machine learning system.

17 Claims, 10 Drawing Sheets

SYSTEM AND METHOD FOR MODELING PHYSICAL OBJECTS IN A SIMULATION

BACKGROUND

Simulation is an important field because it allows for realistic interactions with an environment that would otherwise be expensive, time-consuming, or dangerous to produce in the real world. For example, simulating the flight of an aircraft or spacecraft is far less expensive, safer, and more practical than testing the aircraft or spacecraft in the real world. Simulation is also useful in training applications where training on an actual device or vehicle would be dangerous or expensive. Simulations may be used to predict the outcome of an interaction with the real world, but the accuracy of the simulation's prediction is generally dependent on the accuracy of the simulation. In some real-world environments, however, measuring necessary parameters of some objects directly for modeling in simulation may be impractical or even impossible.

BRIEF DESCRIPTION OF THE DRAWINGS

Various techniques will be described with reference to the drawings, in which.

DETAILED DESCRIPTION

Figure 1:
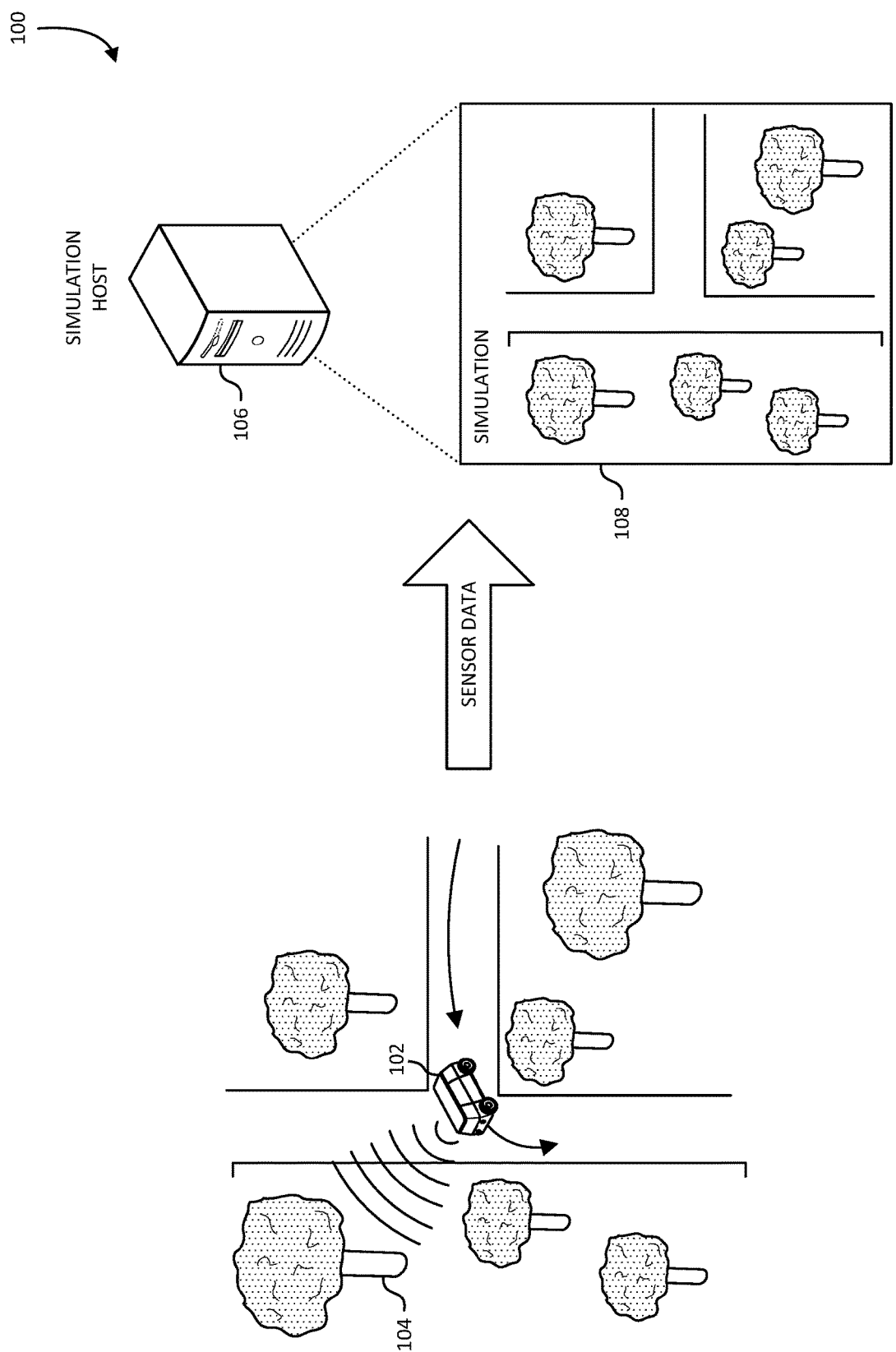
FIG. 1 illustrates an example of a system that generates a simulation of a real-world environment.

The present document describes a system that creates a simulated environment which includes objects constructed based on real-world sensor data. In various examples, an object generator is able to create object models for a class of objects using various object parameters. In one example, a vegetation generator creates an object model for a tree using a set of parameters that specify the size of the trunk, the height of the tree, the tree species, the color of the foliage and so on. In another example, a rock generator generates a rock given the parameters of width, height, color, and texture. In yet another example, a vehicle generator generates a vehicle given the parameters of type, color, length, and width. In order to generate an accurate simulation of a real-world environment, it is desirable to replicate the objects in the real-world environment with objects that respond similarly in the simulation.

Object models are created by supplying a set of object parameters (object parameter sets) to the object generator. For example, to generate a tree, parameters such as trunk width, trunk height, overall tree height, canopy shape, foliage color, and foliage density are provided to a vegetation generator, and the vegetation generator generates an object model for the tree (a tree object model). In another example, to generate a rock, parameters such as rock texture, color, height, and width are provided to a rock generator which produces an object model for a rock (rock object model) in accordance with the supplied parameters. In another example, to generate a piece of vegetation, parameters such as vegetation type, color, height, and species are provided to a vegetation generator which produces an object model for the piece of vegetation (vegetation object model) in accordance with the supplied parameters. As non-limiting examples, such models may correspond to meshes and/or textures for incorporation into the simulated environment. In various examples, the object models need not be physically realistic. In such examples, it is sufficient for the object models to produce a sensor return signal consistent with a sensor to be tested. As a non-limiting example, the object model may provide radar returns consistent with a radar return for a tree in a real environment, yet look nothing like a tree optical, in lidar, or other sensor modalities.

In many situations, the specific parameters needed by an object generator to reproduce a real-world object may not be available or easily obtainable. Techniques described herein provide an object-generation interface that allows object parameters to be inferred from real-world sensor data associated with the object to be simulated. In one example, the object-generation interface is trained by generating a plurality of object parameter sets for an object generator, generating object models for each of the object parameter sets in the plurality of object parameter sets, and then generating simulated sensor return signals for each object model generated. The simulated sensor return signal for each object and the object parameter sets for each object are provided to a machine-learning system that uses the information to learn how to predict a set of object parameters when provided with a sensor return signal of an object. Once the machine-learning system is properly trained, a sensor return value collected in the real world can be provided to the interface, and the interface will generate a set of object parameters that, when provided to an object generator, produce an object model that will produce a similar sensor return signal when placed in a simulation.

The resulting object models can be used in many examples to produce an accurate simulation. In various examples, an accurate simulation of a real-world environment can be constructed by collecting sensor data for the objects in the real-world environment, using the calibrated interface to convert the sensor data into object parameters, using the object parameters to generate object models for the objects, and then placing the object models into the simulation. In one example, an accurate simulation for a vehicle control system is generated by collecting sensor information from a vehicle operating in the real-world environment. The sensors may include cameras, infrared cameras, radar, ultrasonic sensors, or light detection and ranging ("LIDAR") sensors. Additional examples of sensors are described below in the description of FIG. 10. Using the sensor data collected from the real-world environment, individual objects are identified, and for each object, sensor return values associated with the object are provided to the object-generation interface. The object-generation interface uses the real-world sensor data to generate a set of object parameters that, when provided to an object generator, produce an object model that will produce a similar sensor return pattern in the simulated environment.

As one skilled in the art will appreciate in light of this disclosure, certain examples may be capable of achieving certain advantages, including some or all of the following: (1), increasing the accuracy of a simulated environment by generating objects within the simulation from sensor data collected in the real world (2), allowing existing object generators to be leveraged by providing an interface that converts desired sensor returns to appropriate object parameters (3), reducing the amount of effort required to generate the simulated environment by producing the objects in the environment from recorded sensor data.

For example, the system makes it easier to create a realistic simulation of a real-world environment by reducing or eliminating the need to collect specific object parameters for each real-world object. Instead, sensor data can be collected from the real-world, and object parameters inferred from the sensor data. In addition, objects generated in this way are more likely to produce sensor returns in simulation that are very similar to the sensor returns produced in the real world.

FIG. 1 illustrates an example of a system 100 that generates a simulation of a real-world environment. The system 100 includes an instrumented vehicle 102 that navigates a real-world environment. The instrumented vehicle 102 can be a car, a drone, or mobile platform containing a set of instruments the collect sensor feedback from the real-world environment (e.g., a smartphone carried by a user). In various examples, the sensors of the instrumented vehicle 102 may include one or more of a still camera, a video camera, an infrared camera an infrared video camera, a radar, a LIDAR, an ultrasonic sensor, a range finding laser, a microphone, a thermal imager, depth cameras, and the like. The sensors of the instrumented vehicle 102 collect sensor return data from various objects in the real-world environment. The objects may include people, other vehicles, buildings, vegetation, rocks, bicycles, road signs, and structures. Vegetation may include shrubs, flowers, trees, grass, ground cover, plants, and even artificial plants. Some implementation may use distinct processing paths for different types of vegetation. For example, a tree object generator, and a shrub object generator may be provided. For example, the sensors of the instrument vehicle 102 may collect sensor return data from a tree 104.

In an example, the system uses the sensor data collected by the instrumented vehicle 102 to create an accurate simulation 106 of the real-world environment which is hosted by a simulation host 108. The real-world environment includes a number of different objects such as trees, rocks, buildings, and road signs. For each type of object, an object generator is provided that generates an object model given a set of parameters particular to the object type. In one example, the simulation 106 is generated by configuring an object-generation interface for each object generator that converts sensor data collected by the instrumented vehicle 102 into a set of object parameters that are compatible with the object generator. In at least some examples, such collected sensor data may additionally, or alternatively, be used to generate a map (such as a mesh) of the corresponding environment. Examples of such map generation is described in U.S. patent application Ser. No. 15/674,853 entitled "Vehicle Sensor Calibration and Localization" and U.S. patent application Ser. No. 15/675,487 entitled "Sensor Perturbation," the entire contents of which are hereby incorporated by reference. Once configured, the object-generation interface and the object generator may be used to generate object models for real-world objects in the real-world environment using the sensor data collected by the instrumented vehicle 102.

In various examples, the object-generation interface is configured using a machine learning system that predicts a set of object parameters for an object, given a set of sensor return data for the object. In order to train the machine learning system, the object-generation interface generates a sampling of objects using a variety of object parameters. For each object in the sampling of objects, the object-generation interface models the object and predicts the sensor returns that the object would produce. The simulated sensor returns and the object parameters are provided to the machine learning system, and the machine learning system identifies correlations between sensor returns and object parameters so that estimated parameters can be determined from sensor return data sufficient to substantially recreate a virtual model to create similar simulated returns in a simulation (e.g., the parameters may vary from the actual parameters of the real world, but may be sufficient for adequately recreating such sensor signals). Simulated sensor returns for an object model can be obtained by placing the object in the simulation itself, and measuring the simulated sensor returns within the simulation. As a non-limiting example, to determine optical returns, such a model may be introduced into the simulation 106 and one or more images (simulated images by raycasting, simulated lidar returns, simulated radar returns, etc.) of the model may be rendered from varying perspectives and/or distances. In some examples, images may be rendered in different lighting and environmental conditions which may correspond with varying conditions in the real world (e.g., snow, ice, ambient lighting, material surfaces, differing backgrounds, and the like). In this way, the simulated object in the simulation can reasonably be expected to respond to the sensors of a simulated vehicle similarly to those of the instrumented vehicle 102.

In some examples, the machine learning system of the object-generation interface is implemented using a machine learning algorithm and a set of learning objects created from a set of generated learning-object parameters. Examples of suitable machine learning systems include those illustrated in FIG. 10 and described below in the associated written description. In one example, the machine learning system uses a linear regression algorithm and the sampling of objects is generated by varying individual parameters of the set of object parameters so that the relationship between the sensor return values of an object and object parameters of the object can be determined. In some implementations, logistic regression is used to find the values for the coefficients that weight each object-generation parameter. In other various implementations, k-means, k-medians, linear discriminant analysis classification regression trees, Naive Bayes, K-Nearest Neighbors, ("KNN"), learning vector quantization, support vector machines ("SVM"), random forest, or boosting algorithms may be used to implement machine learning system. In some examples, the selection of the machine learning algorithm is based at least in part on the type of objects being generated, and the selection of learning object parameters is based at least in part on the machine learning algorithm selected.

In one example, the machine learning system generates a plurality of object models from a corresponding plurality of object parameters. Each object model in the plurality of object models is placed in the simulated environment, and a sensor return value is generated for each object model. In one implementation, the sensor return value is an image such as a visual image, a LIDAR image, or a radar image. The machine learning system stores the sensor return value in association with the parameters used to generate the object model as a machine learned model.

In one example, when requester provides an image (sensor return) acquired from a real-world object, the machine learning system compares the image from the real-world object to the images stored in the machine learned model, and identifies the particular object model having an image most similar to the image acquired from the real-world object. In various implementations, this can be accomplished using an image comparison metrics such as mean squared error ("MSE") or peak signal-to-noise ratio ("PSNR"). In some examples, the images may be normalized to aid in comparison. Using the information in the machine learned model, the parameters associated with the similar object are identified and returned the requester. In at least some examples, such a comparison may not be performed. In such examples, the real world sensor data may be input into the machine learning model in order to retrieve such parameters.

The various examples may create object-generation interface for one or more object types. For example, various examples may include object-generation interfaces for trees, rocks, buildings, vehicles, pedestrians, road signs, and other objects present in the real-world environment. Once the object-generation interface is configured using the generated learning objects, the sensor data collected by the instrumented vehicle 102 can be analyzed to identify the types of objects present in the real-world environment. Sensor return data from each object detected in the real world is fed to an object-generation interface that produces object parameters for the real-world object. The object parameters are used to generate an object model for the object which can then be placed in the simulation 106 as a proxy for the real-world object.

The simulation 106 can be used in a variety of ways. For example, the simulation 106 can be used to test or train a vehicle control system connected to the simulation 106. In another example, the simulation 106 may operate within an autonomous vehicle controller and allow the vehicle to predict the result of actions in the real world.

Figure 2:
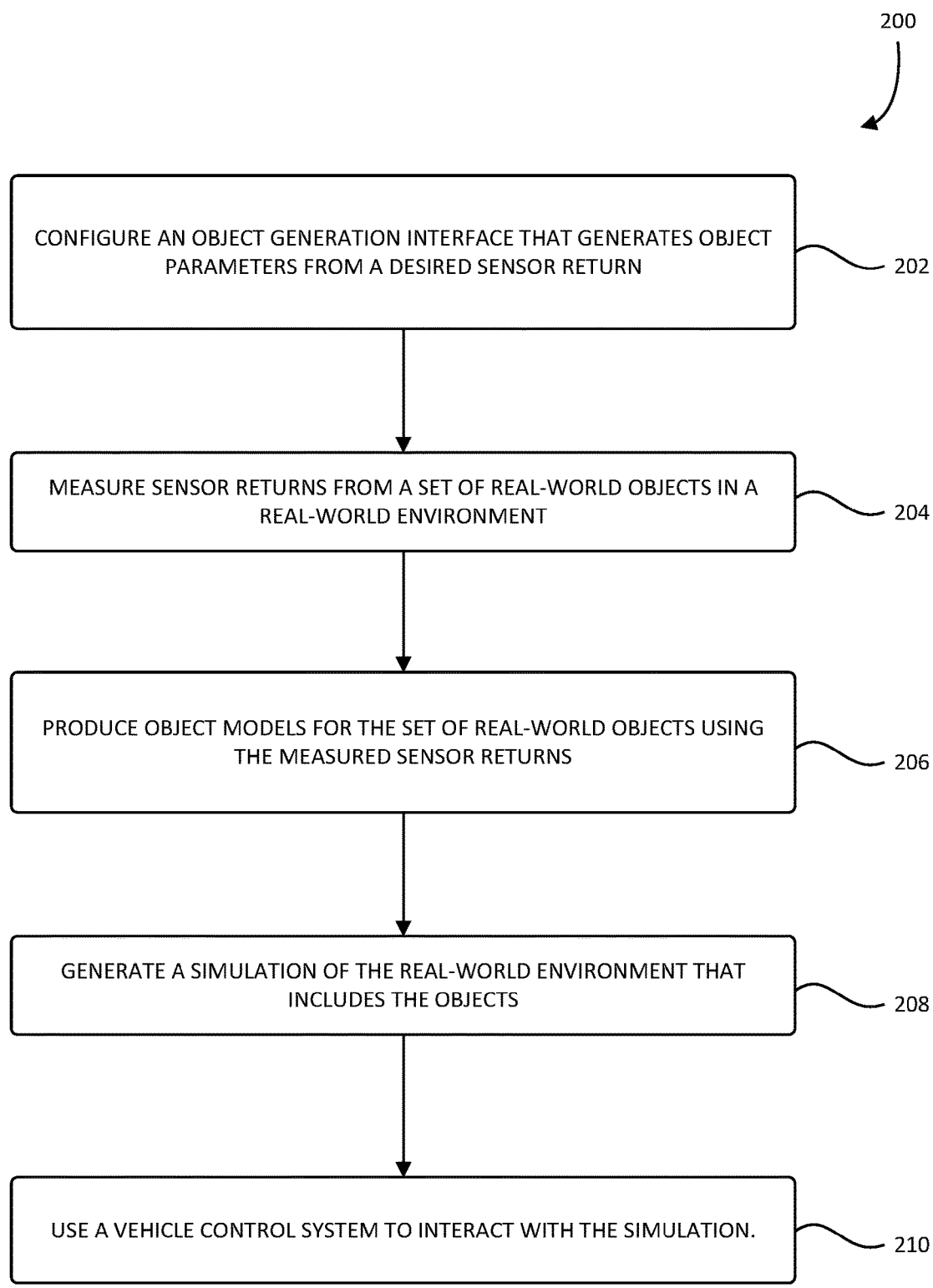
FIG. 2 illustrates an example of a process that, as a result of being performed, produces a simulation that includes models of real-world objects based on collected real-world sensor data.

FIG. 2 illustrates an example of a process 200 that produces a simulation that includes models of real-world objects based on collected real-world sensor data. At block 202, the system produces an object-generation interface that is able to produce object parameters from a desired sensor return value. In some implementations, the object-generation interface generates a set of learning objects by generating a sampling of object parameters and then generating objects for those parameters. In various implementations, the object parameters may be generated by sampling each parameter over a designated distribution, a random sampling, or a combination of permutations. The algorithm used to generate the object parameters may be based at least in part on output from a machine learning algorithm implemented by the object-generation interface trained to output such parameters based on input sensor data. A simulation host places each generated object into a simulation, and a simulated sensor return signal is determined for the object. The parameters and the simulated sensor return are provided to the machine learning algorithm for training purposes. Training the system is the process of generating and storing state information in the form of a machine learned model that allows the system to perform its intended function. In some implementations, training is accomplished by providing the system with sample data, and the system processes the sample data to infer the transformation between the desired input and output of the system. Differences between the output and a known, or "ground truth," expected output can be used, in turn, to refine the model to minimize such differences. In the case of neural networks, such refinement may comprise back propagation. In one example, input data may comprise synthetic image data (e.g., renderings) of object models having corresponding ground truths of the object parameters. Training data can be provided by uploading the training data into a storage device accessible to the machine learning system, transferring the data as part of a function call that provides the training data, or transferring the training data via an I/O channel. After training the machine learning algorithm implemented by the object-generation interface, the object-generation interface is able to predict object parameters for an object given a set of sensor return data.

In an example, at block 204, the instrumented data collection vehicle collects sensor return data from objects in a real-world environment. In some implementations, the vehicle is a car equipped with video cameras, LIDAR, radar, and ultrasonic sensors, and the real-world environment is a city street. As the vehicle travels the city, the vehicle collects sensor return data for various objects such as other vehicles, traffic signals, buildings, pedestrians, trees, bushes, rocks, and vegetation. In another implementation, the vehicle is a drone equipped with one or more of the above sensors.

In an example, at block 206, the simulation host acquires the sensor data collected by the instrumented data collection vehicle. The simulation host is a computer system containing memory and one or more processors. The memory includes instructions that, as a result of being executed by the one or more processors, cause the computer system to generate a simulation in accordance with simulation data maintained on a storage device accessible to the simulation host. The simulation host generates the simulation data using the sensor data by identifying the objects in the real-world environment, identifying the sensor return data associated with each object, and using the object-generation interface to generate a simulated object for the real-world object, using the sensor return data associated with the real-world object. The simulation host may generate simulated objects for trees, bushes, buildings, rocks, other vehicles, and other object types using a variety of object generators.

At block 208, the simulation host generates a simulated environment. In at least some examples, such an environment may be determined in accordance with the techniques described in U.S. patent application Ser. No. 15/674,853 entitled "Vehicle Sensor Calibration and Localization" and U.S. patent application Ser. No. 15/675,487 entitled "Sensor Perturbation." In such examples, other data associated with the sensor data may be used to associate the simulated objects with the simulated environment (e.g., a localization of the object in the real world). The simulated objects and the simulation data are maintained on a storage device. The simulated environment contains simulated objects that correspond to the real-world objects in the real-world environment. Because the simulated parameters of the situated objects are generated to produce a sensor return value that is similar to the sensor return value measured in the real world, the simulated environment provides an accurate reproduction of the real-world environment.

At block 210, the simulated environment interacts with a control system. In some examples, the control system is a physical device such as an autonomous car or driver assisted automotive control system with an interface that allows sensor inputs to be provided to the control system from the simulation. In other examples, the control system is a software component hosted by the simulation host which operates within the simulation for testing purposes, or to develop machine learning algorithms. In another example, the control system is a computing device that hosts a software-based control system with a simulated sensor interface that allows interaction with the simulated environment.

Figure 3:
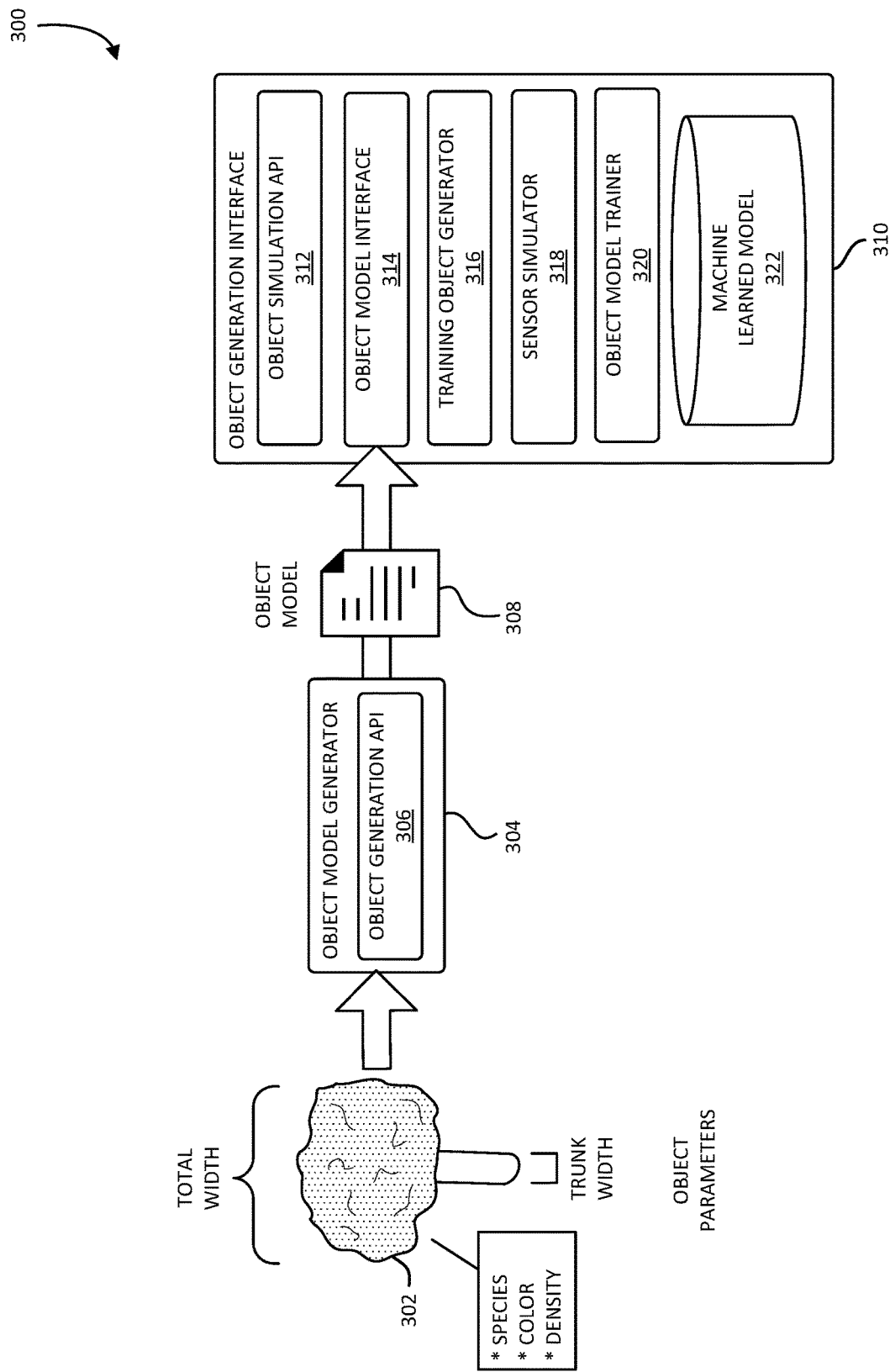
FIG. 3 illustrates an example of a system that uses machine learning to train an object-generation interface so that the interface is capable of producing object models from a given sensor return value.

FIG. 3 illustrates an example of a system 300 that uses machine learning to produce an object-generation interface capable of producing object models from a given sensor return value. In various implementations, object generators exist for a variety of object types such as trees, shrubs, rocks, buildings, and other object types. These object generators require a set of parameters that in general, depend upon the type of object being generated. For example, a tree object 302 may be generated by an object model generator 304 using parameters that include a trunk width parameter, a total width parameter, a tree height parameter, a tree species parameter, a color parameter, and a foliage density parameter. When the parameters are provided to an object generation API 306 of the object model generator 304, the object model generator 304 produces an object model 308 that corresponds to the tree object 302. The object model 308 is a mathematical representation of the tree object 302. In some examples, the object model 308 is a three-dimensional model, such as a mesh, including textures that can be rendered in a simulated environment. In various examples, 3-D models represent a physical body by specifying a collection of connected points in three-dimensional space that define a surface such as a triangle, circle, or polygon. In some implementations, services are further defined to the use of texture mapping where predefined patterns of color and texture are applied to the surface. An object model may be a solid 3-D model or shell model.

In some implementations, the object model generator 304 is a computer system with one or more processors and memory storing executable instructions that, as a result of being executed by the one or more processors, cause the computer system to generate object models based on object parameters provided to the object model generator 304. In other implementations, the object model generator 304 is a software component hosted on a computer system with other parts of the system. An object model may be stored in a variety of formats including a stereolithography ("STL") format, a collaborative design activity ("COLLADA") format, an initial graphics exchange specification ("IGES") format, or a standard for the exchange of product data ("STEP") format.

The system includes an object-generation interface 310. The object-generation interface 310 is a mechanism that generates object models from sensor return data. The object-generation interface 310 can be implemented as a computer system with one or more processors and memory storing instructions that, as a result of being executed, cause the computer system to implement the subsystems described below. The object-generation interface 310 can be a stand-alone computer system dedicated to this task or a subsystem of another computer system such as the simulation host. The object generation interface 310 may receive requests via an application programming interface, a web interface, a remote procedure call interface, or messaging interface. In various examples, the request includes sensor data for a real-world object, and the object-generation interface 310 returns a set of object parameters that correspond to the sensor data. The object-generation interface 310 includes a number of software components that include an object simulation API 312, an object model interface 314, a training object generator 316, a sensor simulator 318, and object model trainer 320, and a machine learned model 322. Though depicted as residing in a same system, such as object generation interface 310, such object simulation API 312, an object model interface 314, training object generator 316, sensor simulator 318, and object model trainer 320, and machine learned model 322 may reside in multiple systems such that the machine learned model 322 is trained on a first system and transferred to a second system.

The object simulation API 312 is an interface used by a simulation host to generate objects. The object simulation API 312 takes a set of sensor return data as input and produces an object model for an object that will produce a sensor return similar to the provided sensor return data. In some implementations, the object simulation API 312 takes object type identifiers as input, and returns an object model of the identified object type. For example, the object simulation API 312 may return a tree object model, a building object model, or a rock object model that matches the provided sensor return data.

The object model interface 314 is an interface that allows the object-generation interface 310 to communicate with the object model generator 304. The object model interface 314 provides an interface to other components of the object-generation interface 310 by accepting object parameters, providing the parameters to the object generation API 306, obtaining the object model 308 from the object model generator 304, and providing the returned object model to other components of the object-generation interface 310. In some implementations, the object model generator 304 is hosted on a computer system separate from the computer system that hosts the object-generation interface 310, and the object model interface 314 may include a communication driver, network driver, web service interface, or other communication interface that allows communication between the object-generation interface 310 and the computer system that hosts the object model generator 304. In other implementations, the object model generator 304 is hosted on the same computer system that hosts the object-generation interface 310, and the object model interface 314 facilitates interprocess communication between the object-generation interface 310 and the object model generator 304.

The training object generator 316 generates training data that is used by the object-generation interface 310 to configure the machine learned model 322. The training object generator 316 generates a set of object parameters, generates objects for those parameters via the object model interface 314, and uses the sensor simulator 318 to predict the sensor return value of each generated object. The object parameters and the simulated sensor return value for each object are provided to the object model trainer 320, which adapts the machine learned model 322 so that the object-generation interface 310 can accurately predict object parameters from provided sensor return data. In some examples, the training object generator 316 is performed on a computer system other than the object generation interface such as a cloud computing system or remote computer system. In such examples, the training object generator 316 is omitted from object generation interface 310, and the machine learned model 322 generated during the training process is transferred from the cloud computing system or remote computer system to the object generation interface 310.

In one example, the object-generation interface 310 performs a configuration sequence before objects can be requested using sensor data. In an example, the training object generator 316 generates a plurality of object parameter sets. The parameter sets may include a range of values for each parameter in combinations and permutations with other object parameters. For example, the parameter sets might be "fir trees", with a height of 5 to 50 feet at 5 foot increments, and width of 2 to 20 feet at 2 foot increments. For each set of parameters, the object-generation interface 310 uses the sensor simulator 318 to generate a simulated sensor return for each object. The simulated sensor return and the associated parameters of the object are provided to the object model trainer 320 which applies a machine learning algorithm to update a machine learned model 322. The contents of the machine learned model 322 depend on the machine learning algorithm implemented but may include statistical measures, correlations, and model parameters. After processing a sufficient quantity of the generated objects and associated sensor returns, the object-generation interface 310 is ready for use and can produce an object model from a given sensor return.

For example, sensor return data from a real-world object collected in the real-world environment, can be provided to the object simulation API 312 of the object-generation interface 310. The object-generation interface 310 uses the machine learned model 322 to convert the sensor data to a set of object parameters that are simulated to produce an object with a similar sensor return value. The object-generation interface 310 uses the object model interface 314 to submit the set of object parameters to the object model generator 304 and receives an object model in response. The object simulation API 312 then returns the object model to the caller. In this way, the object-generation interface 310 is able to produce object models that produce reasonably close analogs for real-world objects.

Figure 4:
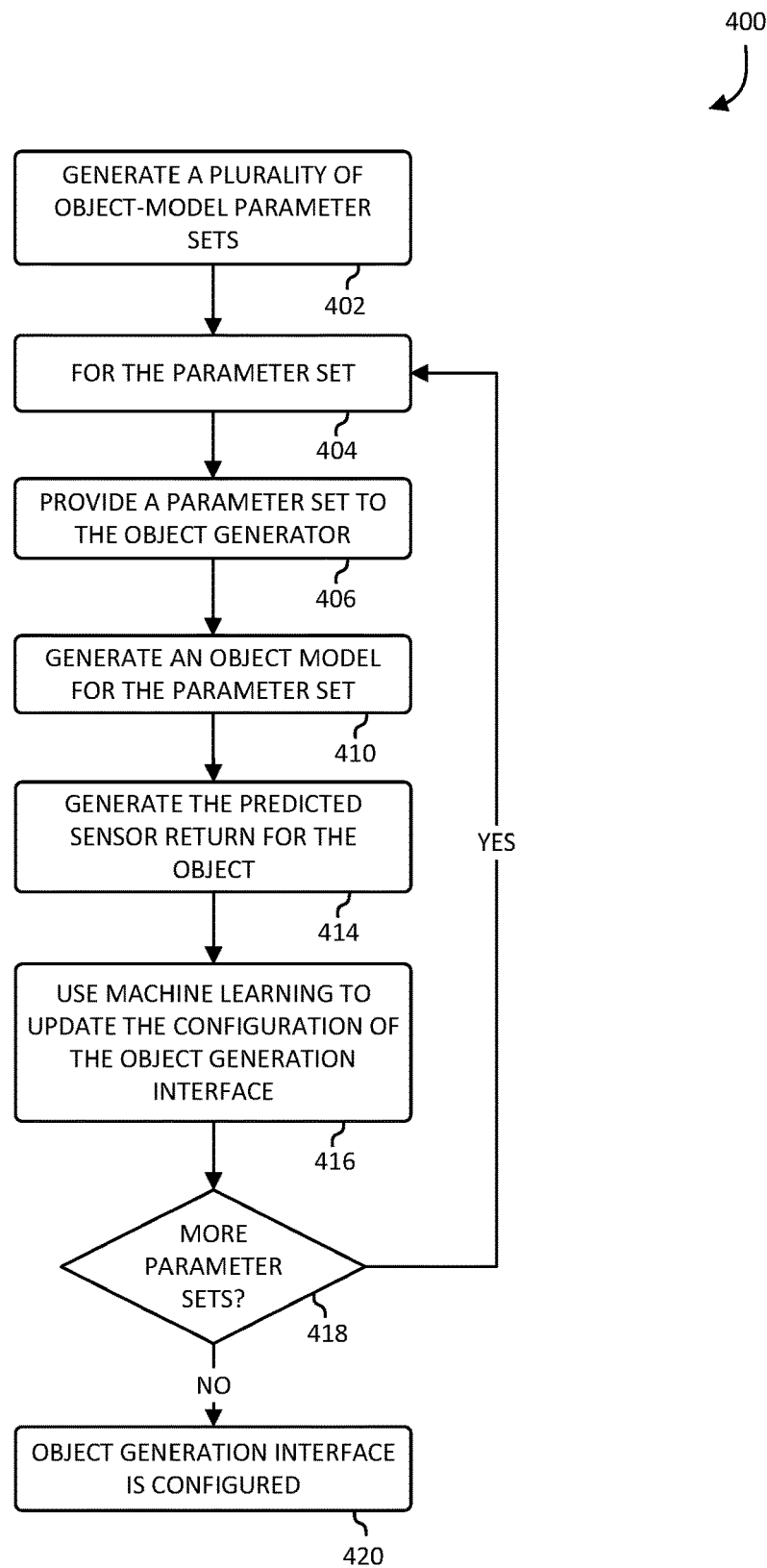
FIG. 4 illustrates an example of a process that trains the object-generation interface to produce object models from real-world sensor data.

FIG. 4 illustrates an example of a process 400 that trains the object-generation interface to produce object models from real-world sensor data. In one implementation, at block 402, the object-generation interface generates a plurality of object-model parameter sets. Each object-model parameter set includes a number of parameters sufficient to generate an object model. The parameters generated are based at least in part on the type of object produced and the requirements of the object generator. For example, a tree generator may require a trunk width, a tree height, a tree color, a foliage density, and a canopy shape. The number of parameters generated is based on the machine-learning algorithm implemented by the object-generation interface. In general, larger numbers of parameters are capable of producing a more accurate configuration for the object model interface, thereby allowing the creation of more accurate objects from measured sensor data.

At block 404, the object-generation interface initiates a loop that iterates over individual generated parameter sets. At block 406, the object-generation interface provides the set of object parameters to an object generator. In some implementations, the object-generation interface identifies a particular object generator to which the parameters are provided based on an object type. For example, the object-generation interface may provide parameters to a tree generator, rock generator or a building generator based on an object type identifier associated with a set of object parameters.

At block 410, the object generator generates an object model in accordance with the supplied parameters. The object model is a mathematical representation of a three-dimensional object. In some examples, the object model includes texture mapping and/or color maps to provide a realistic model that can be rendered and presented as a three-dimensional rendering in a computer simulation. In examples where LIDAR is used a ray casting of light sources can be created given a specified secularity of a surface. In some examples, models need not be physically realistic in all modalities. For example, we some implementations may generate radar/LIDAR returns that may differ substantially from the optical model in simulation. In various examples, a simulation is a mathematical model of an environment that generally defines a coordinate space and physical rules that govern the environment. For example, the physical rules can describe gravity, air resistance, and signal transmission within the environment. When an object model is added to a simulation, a simulated object is created that interacts with the environment and other objects in the simulation.

At block 414, the object-generation interface generates a set of simulated sensor returns for the object. Individual sensor returns are generated from a variety of angles, distances, lighting conditions, and environmental conditions (differing backgrounds, snow, ice, time of day, season, etc.). In some implementations, the object is placed into a simulated environment, and the simulation subjects the object to simulated sensors that generate simulated sensor return data. The simulated sensor return data and the object parameters are provided 416 to a machine learning algorithm. The system uses the object parameters and the simulated sensor return data as training input to a machine learning algorithm that is configured to derive an inverse function capable of predicting object parameters from a given set of sensor return data. At block 416, the object-generation interface updates a machine learned model based on the provided object parameters and simulated sensor return data.

At decision block 418, the object-generation interface determines whether there are additional parameter sets to process. If there are additional premises to process, execution returns to block 404 where the object generation interface generates an additional object model for the next parameter set. If all of the parameter sets have been processed, execution advances to block 420. At block 420, configuration of the object model within the object-generation interface is complete and object requests based on sensor return data can be processed.

In some examples, training data can be generated in batches, and provided to the machine learning system in a single operation after it has been generated. For example, blocks 404, 406, 410, and 414 can be performed for each parameter set, and then the resulting sensor returns and parameter sets can be provided after all the training data is produced.

Figure 5:
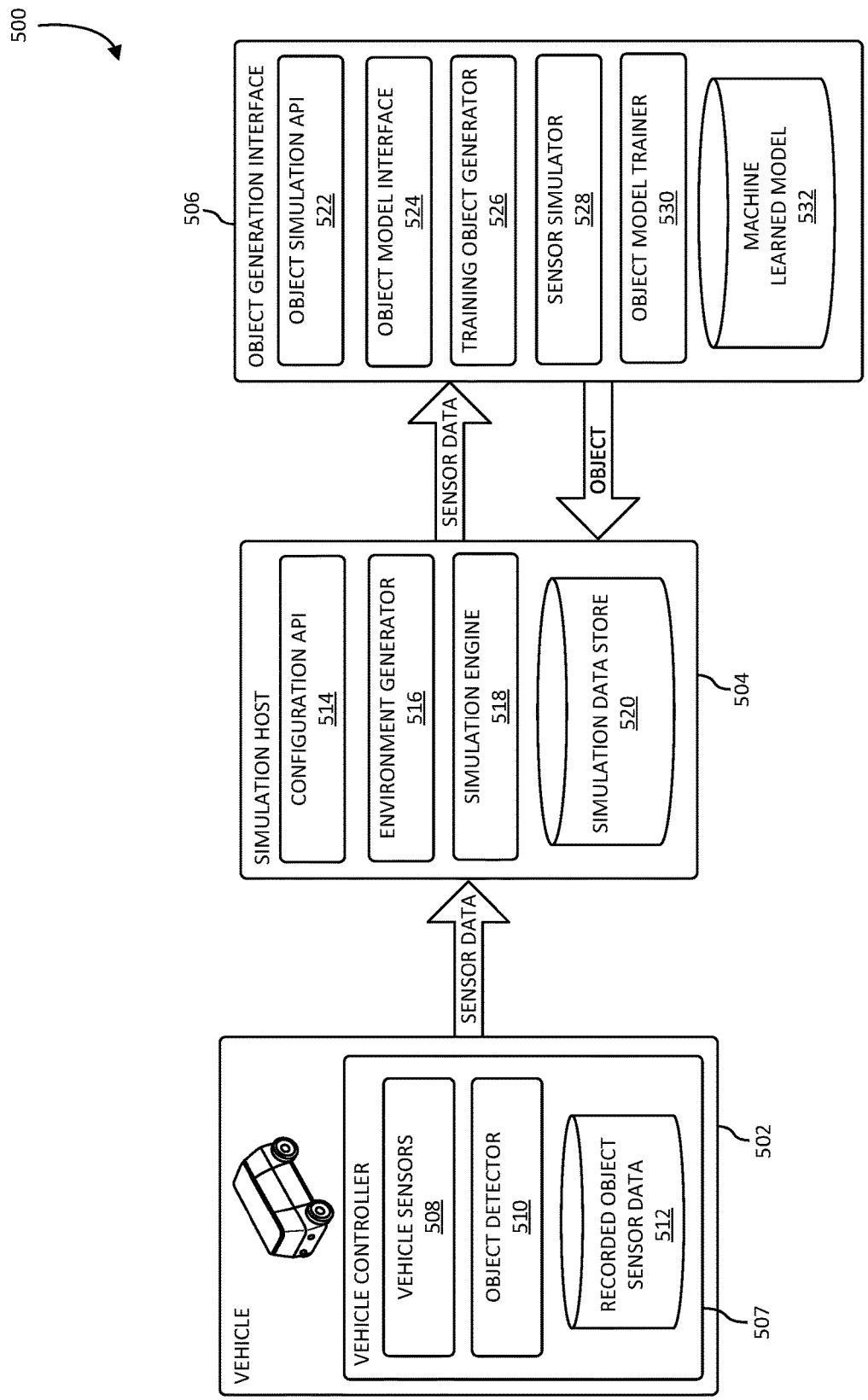
FIG. 5 illustrates an example of a system that generates a simulation of a real-world environment by creating objects in the simulation that are based on sensor data collected in the real-world.

FIG. 5 illustrates an example of a system 500 that generates a simulation of a real-world environment by creating objects in the simulation that are based on sensor data collected in the real-world. The system includes a vehicle 502, a simulation host 504, and an object-generation interface 506. In various examples, the vehicle 502 is an automobile, a drone, a robot, or sensor platform that includes a vehicle controller 507. The vehicle controller is a computer system having a processor and memory. The memory contains instructions that implement one or more subsystems of the vehicle controller. The vehicle controller 507 includes a set of vehicle sensors 508, a detector 510, and a sensor data store 512. The detector 510 is a computer system having one or more processors and physical memory storing executable instructions that, as a result of being executed by the one or more processors, cause the computer system to acquire sensor data from a real-world environment, identify objects in the real-world environment, and record sensor data in the sensor data store 512. In various examples, the detector 510 includes a hardware interface to the set of vehicle sensors 508. The hardware interface can be a wired, wireless, infrared, radio frequency, or optical connection. The set of vehicle sensors 508 may include one or more image sensors (RGB cameras, intensity cameras, depth cameras, etc.), radar sensors, LIDAR sensors, or ultrasonic sensors.

The vehicle 502 collects sensor data and provides the sensor data to the simulation host 504. In some examples, sensor data may be stored on a storage device on the vehicle, and the storage devices removed and connected to the simulation host. In other examples, sensor data may be uploaded wirelessly from the vehicle to a central storage location such as a cloud storage service that is accessible to the simulation host. In yet another example, the vehicle 502 may be connected to a wired or wireless computer network, and the sensor data transferred to the simulation host 504 via the computer network. The simulation host 504 is a computer system having one or more processors and memory containing instructions that, when executed by the one or more processors, cause the computer system to generate and maintain a simulation of the real-world environment. The simulation host 504 includes a variety of software components including a configuration API 514, an environment generator 516, a simulation engine 518, and a simulation data store 520. The configuration API 514 is an application programming interface that is used to upload recorded sensor data from the vehicle 502. In some implementations, the simulation vehicle API includes a hardware interface such as a serial, parallel, or wireless interface for uploading sensor data to the simulation host 504. Once the sensor data is uploaded from the vehicle 502, the sensor data is provided to the environment generator 516.

The environment generator 516 uses the sensor data provided by the vehicle 502 to generate a set of object models that correspond to real-world objects in the real-world environment. In some examples, the vehicle 502 provides the environment generator 516 with information that identifies a set of objects detected by the vehicle 502, and the associated sensor data for individual objects. Such detections may be performed by one or more additional techniques. Outputs of such detections may be bounding boxes, segmentations, or other indications of sensor data associated with the individual objects and/or classifications (object type), confidences, and the like. In other examples, the environment generator 516 processes the sensor data to identify objects detected by the vehicle 502, and identifies the sensor data associated with each object detected. For each object detected, the environment generator 516 provides the associated sensor data to the object-generation interface 506, and the object-generation interface 506 returns an object model to the simulation host 504. The environment generator 516 stores the object model in the simulation data store 520.

After the sensor data has been processed and the associated objects have been stored in the simulation data store 520, the simulation host initializes the simulation engine 518 and loads the objects from the simulation data store 520. The simulation engine 518 generates a simulated environment that includes the generated objects, thereby replicating the real-world environment. In various implementations, the simulation host 504 may include an interface that allows interaction with the simulated environment. In some examples, the interface may be hardware interface that allows connection to a control system such as an autonomous vehicle control system. In other examples, the interface may be a software interface that allows the connection of the software-based control system.

The system includes an object-generation interface 506. The object-generation interface 506 generates object models from sensor return data. The object-generation interface 506 can be a standalone computer system dedicated to this task or a software component hosted by the simulation host 504. The object-generation interface 506 includes a number of software subsystems including an object simulation API 522, an object model interface 524, a training object generator 526, a sensor simulator 528, and object model trainer 530, and a machine learned model 532.

The object simulation API 522 is an interface used by the simulation host 504 to generate objects. The object simulation API 522 accepts a set of sensor return data as input and produces an object model for an object that will produce a sensor return similar to the provided sensor return data. In some implementations, the object simulation API 522 takes the object-type identifier as input, and returns an object model of the identified object type. For example, if requested, the object simulation API 522 may return a tree object model, a building object model, or a rock object model that matches the provided sensor return data.

The object model interface 524 is an interface that allows the object-generation interface 506 to communicate with one or more object model generators. The object model interface 524 provides access to the object-generation interface 506 by accepting object parameters, providing the parameters to the object generator, obtaining an object model from the object generator, and providing the returned object model to the object-generation interface 506.

The training object generator 526 generates training data that is used by the object-generation interface 506 to configure the machine learned model 532. The training object generator 526 generates a set of object parameters, generates objects for those parameters via the object model interface 524, and uses the sensor simulator 528 to generate a plurality of sensor return values of each generated object. The object parameters and the simulated sensor return value for each object are provided to the object model trainer 530, which adapts the machine learned model 532 so that the object-generation interface 506 can accurately predict object parameters from provided sensor return data.

Figure 6:
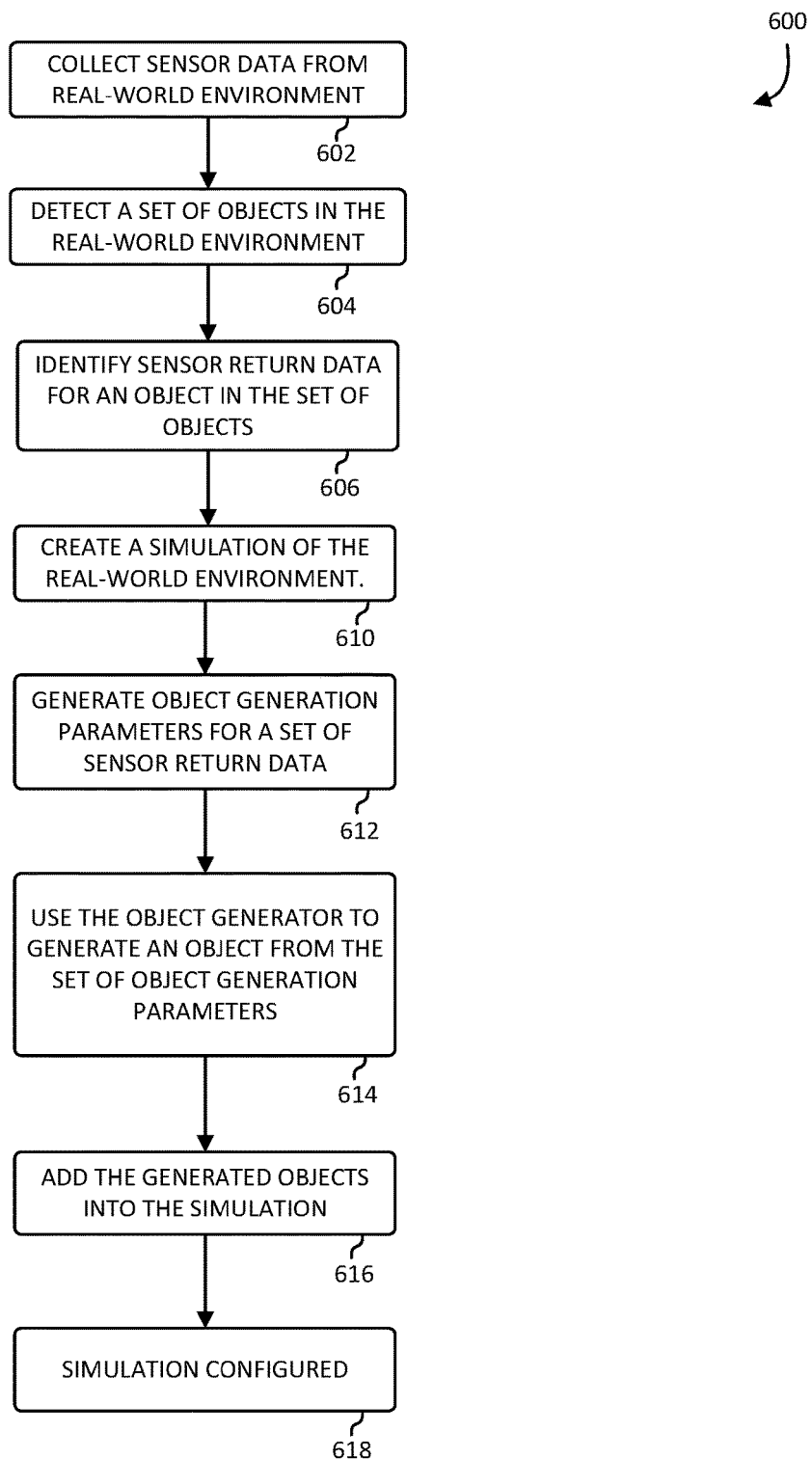
FIG. 6 illustrates an example of a process that produces a simulation of a real-world environment using sensor data collected in the real-world.

FIG. 6 illustrates an example of a process 600 that, as a result of being performed, produces a simulation of a real-world environment using sensor data collected in the real-world. The system may include a data collection agent and simulation host. In some examples, the data collection agent is a computer system that includes a storage device and one or more sensors that collect data from the real-world environment. In some examples, the data collection agent is a vehicle, drone, or mobile robotic platform equipped with a collection of sensors. At block 602, the data collection agent collects sensor data from a real-world environment and stores it in memory on the data collection agent. The sensor data can include video, still images, radar return images, LIDAR return images, and additional sensor data. At block 604, the data collection agent analyzes the sensor data that identifies one or more objects in the real-world environment. In some examples, the data collection agent identifies a type of the object such as a tree, a rock, building, or an automobile. At block 606, the data collection agent identifies sensor return data associated with each object. For example, the data collection agent may identify images, video, radar return images, and LIDAR images of each identified object. Such identification may be performed, for example, by a detector. An example detector may be additional techniques (algorithms, which may include additional machine learned models) to output one or more bounding boxes (two- or three-dimensional), segmentations, or the like, based at least in part on the input sensor data.

The simulation host is a computer system that includes one or more processors and memory for storing executable instructions that, as a result of being executed by the one or more processors, cause the simulation host to generate the simulated environment patterned after the real-world environment measured by the data collection agent. At block 610, simulation host initializes the simulation. Initialization may include initializing the boundaries of the simulation to correspond to those in the real-world environment. At block 612, the simulation host receives the sensor return data and object information from the data collection agent, and uses an object-generation interface to convert the sensor data into a set of object parameters for each object identified by the data collection agent. At block 614, the simulation host provides the object parameters to an object generator to generate an object model for each real-world object. At block 616, the simulation host adds the object models to the simulated environment. At block 618, configuration of the simulation is complete and the simulated environment contains simulated objects to correspond to the objects detected by the data collection agent.

Figure 7:
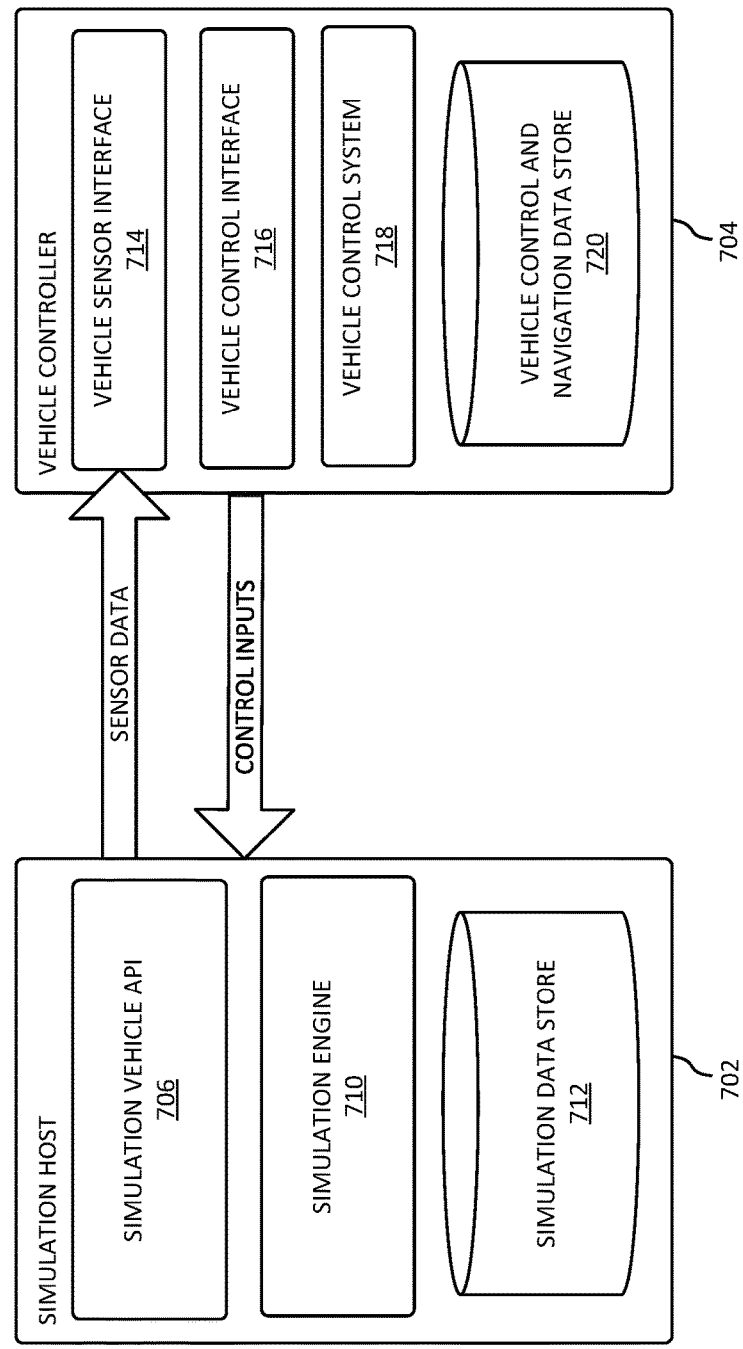
FIG. 7 illustrates an example of a system that provides a simulated environment for a vehicle control system.

FIG. 7 illustrates an example of a system 700 that provides a simulated environment for a vehicle control system. A simulation host 702 is a computer system having one or more processors and memory storing executable instructions that, as a result of being executed by the one or more processors, cause the computer system to provide a simulated environment to which a vehicle controller 704 can be connected. The vehicle controller 704 is a computer system containing one or more processors and memory storing executable instructions that, as a result of being executed by the one or more processors, cause the vehicle controller 704 to acquire sensor data and provide control signals that control the operation of a vehicle. The vehicle controller 704 can be part of an autonomous or semi-autonomous vehicle control system, a driver-assist system for an automobile, a navigation system, or a driver training system.

The simulation host 702 includes a variety of subsystems that include a simulation vehicle API 706, a simulation engine 710, and a simulation data store 712. The simulation vehicle API 706 is an application programming interface that provides an interface to the vehicle controller 704. In some examples, the simulation vehicle API 706 includes the ability to control the actions of a virtual vehicle within the simulation by routing a command signal from the vehicle controller 704 to the simulated vehicle. A command signal is a control signal, command, or output value that can be interpreted by the simulation that influences the state of the simulated vehicle. The state of the vehicle may include the position, speed, and attitude of the vehicle. For example, the command signal may command a turn to the right or left, an increase or decrease in power, or an application of brakes. In another example, the simulation vehicle API 706 includes the ability to acquire virtual sensor data from the virtual vehicle. The simulation engine 710 constructs a simulation based on simulation data loaded from the simulation data store 712. The simulation includes a set of simulated objects constructed from object models in the simulation data. In some examples, the object models are generated from sensor data collected in a real-world environment.

The vehicle controller 704 includes various subsystems that include a vehicle sensor interface 714, a vehicle control interface 716, a vehicle control system 718, and a vehicle control and navigation data store 720. In various examples, the vehicle controller 704 is a process hosted by the simulation host 702. In another example, the vehicle controller 704 is a computer system having at least one processor and memory that hosts the various subsystems. The vehicle sensor interface 714 acquires sensor data from the simulation. In some examples, the vehicle sensor interface is a hardware interface that connects to a corresponding hardware interface on the simulation host 702. In another example, the vehicle sensor interface is a software interface subsystem that acquires simulated sensor data from the simulation host and provides it to the vehicle control system 718. The vehicle control interface 716 outputs control signals to the simulation host. In some examples, the control signals may include a signal to accelerate or decelerate a simulated control, turn right or left, or activate various simulated control inputs in the simulation. In some examples, the vehicle control interface 716 is a physical interface that transmits electrical signals from the vehicle controller 704 to simulation host 702. In additional examples, the vehicle control interface 716 is a digital interface that transmits digital data representing a control signal from the vehicle controller 704 to the simulation host 702.

Sensor data received from the simulation host 702 is provided to the vehicle control system 718 by the vehicle sensor interface 714, and control signals are sent from the vehicle control system 718 to the simulation host 702 via the vehicle control interface 716. In various examples, the vehicle control system 718 implements algorithms and methods designed to control a virtual vehicle within the simulation. The vehicle control system 718 relies on navigational and control information stored in the vehicle control and navigation data store 720. The vehicle control and navigation data store 720 may include information such as street layouts, traffic information, landmark information, navigational aid information, and operational log files. In some implementations, the vehicle control navigation data store 720 includes control information learned during operation of the vehicle controller 704. The control information may be refined over the course of interacting with both a real-world environment and a simulated environment.

Figure 8:
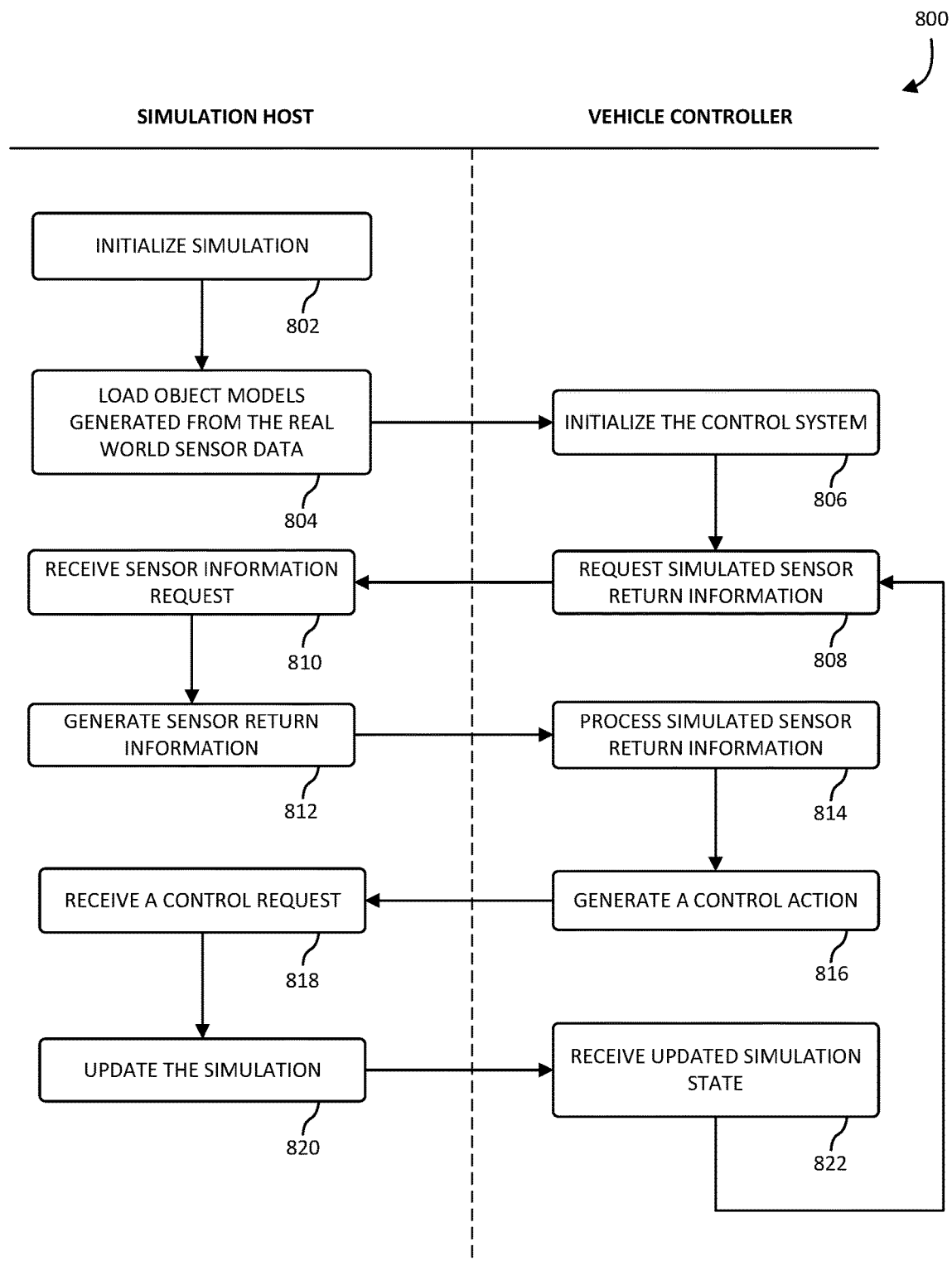
FIG. 8 illustrates an example of a process that provides a simulated environment for the vehicle control system.

FIG. 8 illustrates an example of a process 800 that provides a simulated environment for the vehicle control system. The process begins at block 802 with a simulation host creating a simulated environment. In various examples, the simulated environment includes a simulated vehicle and the simulation host provides an interface that allows an outside entity to issue commands to the simulated vehicle and obtain sensor information from simulated sensors on the simulated vehicle. In some examples, the simulated environment provides an interface that allows a third-party to monitor, manage, or alter the conditions of the simulation. At block 804, the simulation host loads a set of object models produced from real-world sensor data. For each object model, the simulation host generates a simulated object and places the simulated object into the simulation so that the simulation resembles the real-world environment in which the sensor data was collected.

At block 806, the vehicle controller initializes a control system for controlling the simulated vehicle. In some examples, initialization may include creating a connection to the virtual vehicle within the simulated environment. In additional examples, initialization may include synchronizing the position and state of the virtual vehicle with state information maintained by the vehicle controller. For example, vehicle state information may include the vehicle position, heading, velocity, and initial sensor values.

At block 808, the vehicle controller initiates a control loop by requesting sensor return information from the simulation host. At block 810, the simulation host receives the request for the sensor data. In some examples, the request is received via a call to an application programming interface on the simulation host. In other examples, the request is received in the form of an electrical signal received by an interface on the simulation host which is converted to an API call on the simulation host. At block 812, the simulation host determines a set of sensor return information using the state of the simulation and the state of the simulated vehicle, and returns the sensor return information to the vehicle controller. The vehicle controller receives the sensor information at block 814, and provides the sensor return information to a vehicle control system in the vehicle controller. At block 816, the vehicle controller processes the sensor return information and identifies one or more control actions, and provides an indication of the control actions to the simulation host. At block 818, the simulation host receives the control actions from the vehicle controller. Based on the control actions, the simulation host updates 820 the state of the simulated vehicle in the simulation, and the updated vehicle information is returned to the vehicle controller. At block 822, the vehicle controller receives the updated state information from the simulation host. Execution then returns to block 808 when the vehicle controller requests updated sensor information from the simulation host.

In some implementations, the simulation executes in real time and the control loop operates in accordance with the timing established by the vehicle controller. In other implementations, the simulation does not occur in real time, and the passage of time is simulated using an agreed-upon rate. In some implementations, the passage of time may be indicated by either the simulation host or the vehicle controller. Additional options for a vehicle to interact with the simulated environment and show in FIG. 10 and described in the associated written description.

Figure 9:
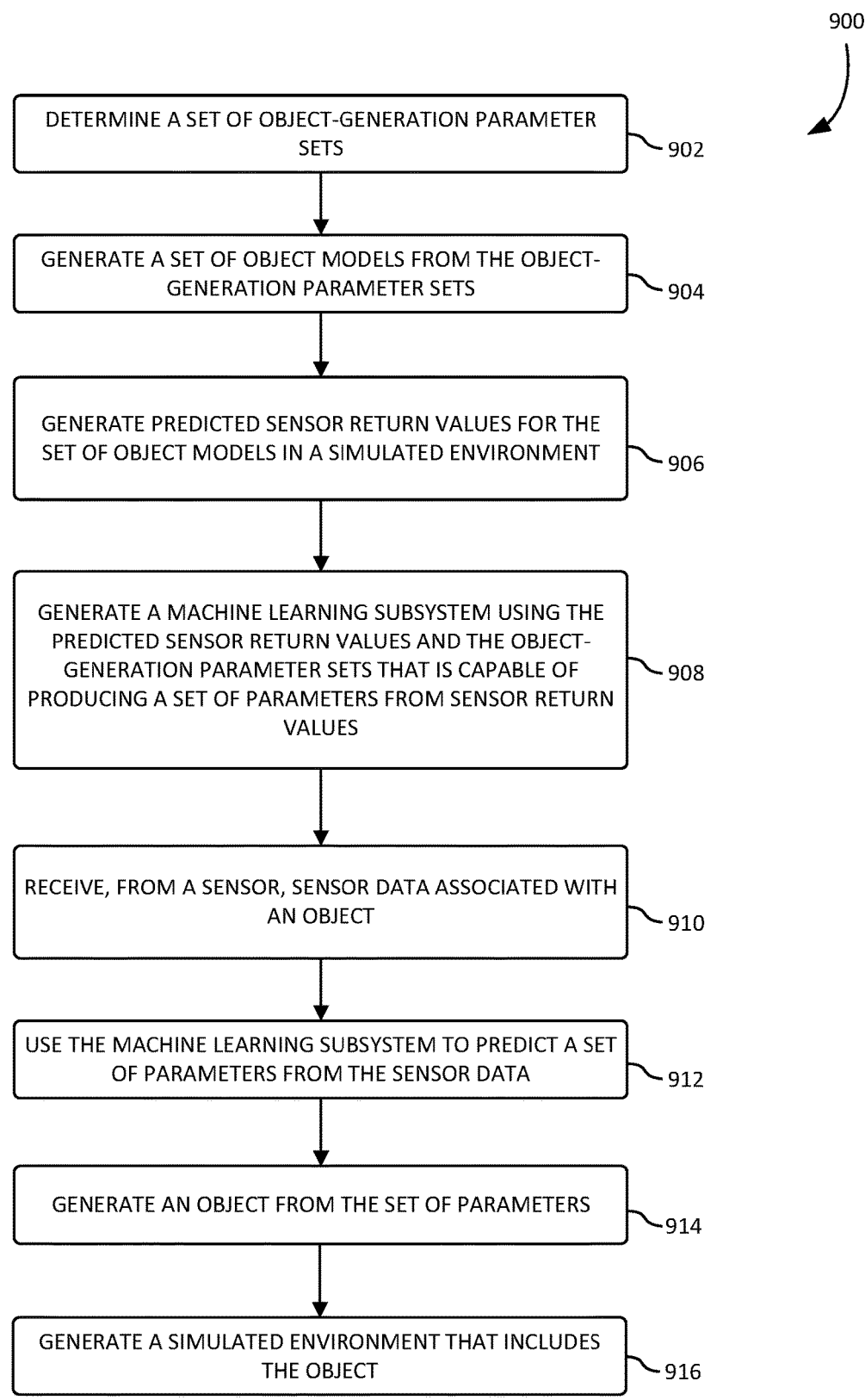
FIG. 9 illustrates an example of a process that generates a simulated environment that includes objects created from real-world sensor data.

FIG. 9 illustrates an example of a process 900 that generates a simulated environment that includes objects created from real-world sensor data. The process begins with the system calibrating an object generator so that objects can be generated from sensor data collected in a real-world environment. The calibration process begins at block 902 with the system generating a plurality of object parameter sets for an object generator. The object generator generates a three-dimensional mathematical model that represents a real-world object. In various implementations, the object generator generates dimensional mathematical models for trees, rocks, buildings, vehicles, or other objects in the environment. The object parameter sets are chosen to provide a reasonable sampling of the range of objects capable of being created by the object generator. For example, object parameter sets may be chosen using random parameter values or by deterministic combinations and permutations of parameters.

At block 904, for each set of object parameters, the system generates an object model by submitting the parameters to the object generator. The object models three-dimensional mathematical models constructed in accordance with the supplied parameters. At block 906, for each object model, the system generates a set of simulated sensor return value.

In one implementation, the system generates a simulation containing the object, and exposes the simulated object to simulated radar, LIDAR, electromagnetic, light-based, or ultrasonic stimulus, and then determines a simulated sensor return value for the object based on the stimulus. The simulated sensor return values may include two-dimensional images (RGB, intensity, depth, etc.), two-dimensional video streams, two- or three-dimensional radar images, and two- or three-dimensional LIDAR images. At block 908, the simulated sensor return values and the parameters used to generate the object are provided to a machine learning subsystem. The machine learning subsystem uses the information to derive a predictive algorithm capable of determining a set of parameters for an object based on the sensor return values. Once the learning period of the machine learning subsystem is complete, the system is capable of generating objects from sensor return values collected in the real world.

In various examples, at block 910, the system receives sensor information associated with a real-world object. The sensor information may be collected from an instrumented vehicle or data collection device and may include camera images, video images, radar returns, or other sensor data. At block 912, the sensor data is provided to the machine learning subsystem, and the machine learning subsystem determines a set of object parameters that will generate a simulated object that will produce a similar set of sensor return values.

At block 914, the system generates an object from the set of parameters provided by the machine learning subsystem. The object may be generated in the form of a three-dimensional mathematical model that is capable of being used in a simulation. For example, the three-dimensional mathematical model may include a mesh object definition and/or textures that can be applied to the surface of the object. At block 916, the system generates a simulated environment that includes the object. In various examples, the process is repeated for the objects in a real-world environment to produce an accurate simulation of the real-world environment.

Figure 10:
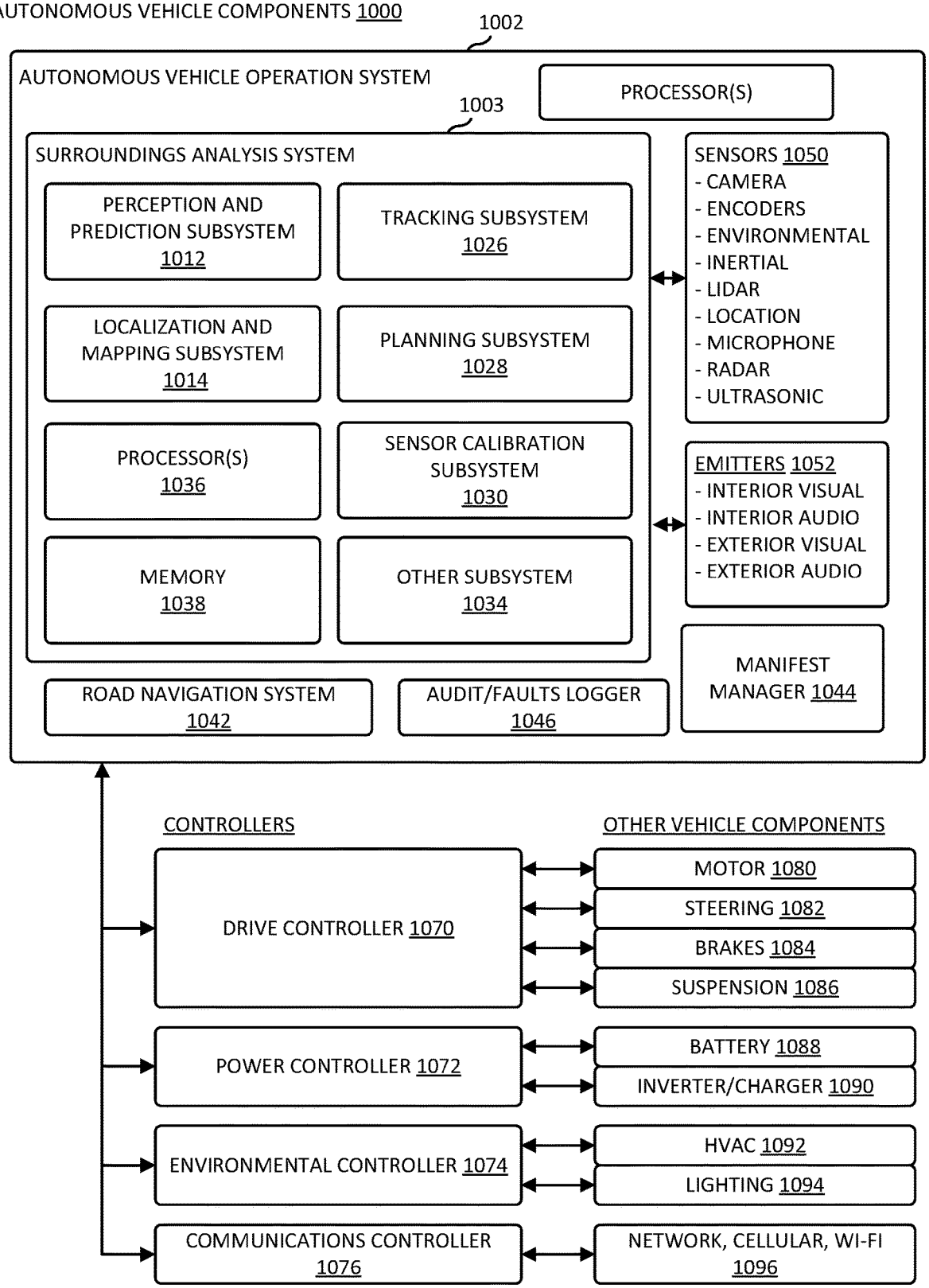
FIG. 10 illustrates a system in which various examples can be implemented.

FIG. 10 illustrates an example of elements that might be used according to an architecture 1000 of an autonomous vehicle. The autonomous vehicle might be characterized as having an autonomous vehicle operation system 1002, coupled to various controllers, which in turn are coupled to various components of the autonomous vehicle to handle locomotion, power management, etc. Elements of the autonomous vehicle operation system 1002 provide for a computational system for implementing object identification and environment analysis, as described herein. These elements might find use in other applications outside of autonomous vehicles.

The architecture 1000 may specify one or more computer system(s) including various hardware, software, firmware, etc., to implement aspects of the systems, methods, and apparatuses described herein. For example, the autonomous vehicle operation system 1002 may include a surroundings analysis system 1003 and other components usable for various aspects of an autonomous vehicle. The surroundings analysis system 1003 might be used to take in information that the autonomous vehicle operation system 1002 might use to operate controllers for a motor, steering, object avoidance, etc.

The surroundings analysis system 1003 might be organized as a plurality of subsystems to simplify implementation. In some examples, the subsystems are implemented independently, while in other examples, more than one subsystem are integrated together in part or in full. The subsystems might include a LIDAR subsystem, a camera subsystem, a radar subsystem, a sonar subsystem, a perception and prediction subsystem 1012, a localization and mapping subsystem 1014, a tracking subsystem 1026, a planning subsystem 1028, a sensor calibration subsystem 1030, and possibly other subsystems 1034. The perception and prediction subsystem 1012 performs object detection, segmentation, and classification of objects from sensor data of various types including LIDAR, radar, and visual images. Prediction may use such sensor data (and/or perception data) to provide assumptions about future behavior of such detected objects.

A given subsystem might be implemented with program code or hardware for communicating with other subsystems, to receive inputs and provide outputs. Some of the inputs might be from sensors. In some description herein, for readability, a subsystem might be described as including sensors from which the subsystem obtains data or signals and/or emitters to which the subsystem outputs data or signals. For example, a sonar subsystem might be described as having an ultrasonic sensor or might be described as receiving signals from an ultrasonic sensor. As another example, a camera subsystem might be described has having a camera and a display or might be described as receiving signals or data from a camera and sending signals or data to a display.

Although not shown in FIG. 10, it should be understood that communication among subsystems can be provided for as needed. A given subsystem might communicate with another subsystem by sending data over some channel directly to the other subsystem, or the surroundings analysis system 1003 might comprise a bus subsystem or communication infrastructure over which subsystems can communicate by passing data and/or signals therebetween. The surroundings analysis system 1003 might also be configured to receive external data and to communicate information to outside the surroundings analysis system 1003.

A given subsystem might have some of its own computational processing, which might be performed by hardware dedicated to that given subsystem or might be performed by a processor or circuit assigned to perform computation of that subsystem, as might be the case where the subsystem is implemented entirely in software and is executed by one or more processor(s) 1036 using a memory 1038, such as a program code memory and data storage memory. The memory might be for temporary storage of variables and data, such as RAM, and memory for permanent storage (i.e., data that persists without needing refresh, power, etc., for some period of life), and should be implied where indicated even if not explicitly mentioned. For example, where a subsystem is described as operating on a database or storing data, there would be some form of memory for storing data in electronically readable form. In some cases, the database or data storage in memory is not specific and internal to one subsystem. In those cases, the memory is accessible by more than one subsystem. For example, one subsystem might create records based on sensor data obtained by that subsystem and write those records to a database or other data structure and, in turn, another subsystem can read and use that data. Where a subsystem is implemented in software, the subsystem might include program code coupled to a processor specific to that subsystem or a more general program code memory and processor.

In some instances, the surroundings analysis system 1003 is employed in an autonomous vehicle. In some instances, the surroundings analysis system 1003 may provide perception and planning functionality for the autonomous vehicle. In general, the surroundings analysis system 1003 may provide for LIDAR perception, radar perception, vision (camera) perception, acoustic perception, segmentation and classification, tracking and fusion, and prediction/planning, as well as interfacing to other controllers, such as a drive controller, a power controller, an environmental controller, and a communications controller.

The autonomous vehicle operation system 1002 may include a road navigation system 1042, a manifest manager 1044, and an audit/fault logger 1046. The autonomous vehicle operation system 1002 might also include, or interface to, various sensors 1050 and emitters 1052.

The autonomous vehicle operation system 1002 might interface to a drive controller 1070 that interacts with motors 1080, steering 1082, brakes 1084, and a suspension 1086, a power controller 1072 that interacts with a battery 1088 and an inverter/charger 1090, an environmental controller 1074 that interacts with heating, venting, air conditioning (HVAC) components 1092 and lighting 1094, and a communications controller 1076 that handles communications between the autonomous vehicle, devices in use with the autonomous vehicle, and external devices, such as via a network, a cellular channel, or a Wi-Fi channel. A combination of autonomous vehicle operation system 1002, the controllers, and the vehicle components installed in an autonomous vehicle can provide for a vehicle that is able to navigate safely without constant human intervention.

The autonomous vehicle operation system 1002 may include any number or type of sensors suitable for use in an autonomous vehicle beyond those illustrated. The various sensors 1050 may include, but are not limited to, ultrasonic transducers, wheel encoders, environmental sensors, microphones, inertial measurement unit(s) (IMU), accelerometers, gyroscopes, magnetometers, temperature sensors, humidity sensors, light sensors, global positioning system (GPS) sensors, pressure sensors, location sensors, etc.

A LIDAR subsystem may include one or more LIDAR sensors to capture LIDAR data for segmentation, as described herein, and may comprise any one or more depth sensors as described in detail herein. In some instances, the LIDAR subsystem 1004 may include functionality to combine or synthesize LIDAR data from a plurality of LIDAR sensors to generate a meta spin of LIDAR data, which may refer to LIDAR data based on multiple LIDAR sensors. In the case of a meta spin of LIDAR data, the LIDAR subsystem may include functionality to determine a virtual origin of the meta spin data (e.g., a coordinate reference frame common to all LIDAR sensors) and perform a data transformation such that LIDAR data from each of the one or more LIDAR sensors is expressed with respect to the virtual origin. As may be understood in the context of this disclosure, the LIDAR subsystem may capture data and may transmit datasets to other subsystems for subsequent processing.

A camera subsystem may include, or interface to, one or more camera sensors to capture vision data for image segmentation and/or classification. The camera subsystem may include any number and type of camera sensors. For example, the camera subsystem may include any color cameras, monochrome cameras, depth cameras, RGB-D cameras, stereo cameras, infrared (IR) cameras, ultraviolet (UV) cameras, etc. As may be understood in the context of this disclosure, the camera subsystem may capture data and may transmit datasets to the other subsystems for subsequent processing. For example, data from the camera subsystem may be included as one or more channels of a multi-channel image that is processed as such by another subsystem.

A radar subsystem may include one or more radar sensors to capture range, angle, and/or velocity of objects in an environment. As may be understood in the context of this disclosure, the radar subsystem may capture data and may transmit datasets to other subsystems for subsequent processing. For example, data from the radar subsystem may be included as one or more channels of a multi-channel image provided to another subsystem.

A sonar subsystem may include, or interface to, one or more speakers or sound emitters and one or more microphones (such as a microphone array) to capture acoustic information from objects in an environment. Additionally, or in the alternative, such a sonar subsystem may comprise various ultrasonic transducers. For example, the sonar subsystem may cause an ultrasonic transducer to emit pulses of sound and may listen for echoes to determine a position and/or motion information associated with objects in the environment. As may be understood in the context of this disclosure, the sonar subsystem may capture data and may transmit datasets to the other subsystems for subsequent processing. For example, another subsystem can fuse data obtained from the sonar subsystem with data obtained from the LIDAR subsystem, in order to more accurately segment objects and/or to determine information about the objects, or for other purposes.

In some instances, the LIDAR subsystem, the camera subsystem, the radar subsystem, and/or the sonar subsystem may provide one or more datasets for other subsystems of the surroundings analysis system for combining and/or synthesizing the data.

The surroundings analysis system 1003 may further include storage for simulated data that has been generated by a computer simulation algorithm, for use in part in testing. In some instances, the simulated data may include any type of simulated data, such as camera data, LIDAR data, radar data, sonar data, inertial data, GPS data, etc. In some instances, surroundings analysis system 1003 can modify, transform, and/or perform the converting operations described herein on the simulated data for verifying an operation and/or for training machine learning algorithms, as described herein. For example, to test some functionality in a laboratory setting, simulated sensor data/signals might be supplied to subsystems as if it were actual sensor data, to test performance of some subsystems. In some implementations, simulated data can include messages, events, and system alerts that are sent to the autonomous vehicle operation system 1002.

The localization and mapping subsystem 1014 may include functionality to convert or map data to a voxel map. For example, the localization and mapping subsystem 1014 can receive LIDAR data, camera data, radar data, sonar data, etc., and map, convert, or associate individual data points to a voxel map representing a three-dimensional space in an environment. A voxel space is a logical representation of a three-dimensional environment, such as the space surrounding an autonomous vehicle, that is represented as discrete small volumes, e.g., voxels. A voxel map provides data or values for respective voxels in the voxel space. As a representation of the three-dimensional environment, the voxel map can be stored in memory and manipulated by a processor.

In some instances, the localization and mapping subsystem 1014 can define dimensions of a voxel space, including a length, width, and height of the voxel space. Further, the localization and mapping subsystem 1014 may determine a size of individual voxels. In some instances, voxels may be a uniform size and shape throughout the voxel space, while in some instances, a size and/or density of voxels may vary based on a relative location in the voxel space. For example, a size of a voxel may increase or decrease in proportion to a distance of the voxel from an origin or center of the voxel space. Additionally, or in the alternative, such a localization and mapping subsystem 1014 may comprise a transformation between a virtual origin and an origin of the voxel space. In some instances, the localization and mapping subsystem 1014 may include functionality to generate a sparse voxel space wherein voxels that do not include data, or that include an amount of data below a data threshold, need not be present in the voxel map and the values of those voxels can be assumed or ignored. In such an instance, the voxel map may be organized as an octomap, a voxel hashing, or the like. In some instances, the localization and mapping subsystem 1014 may include functionality to reduce an amount of noise in the data of a voxel map or the data used to generate the voxel map by filtering data as it is mapped to the voxel space and stored in the voxel map. For example, filtering may include removing data below a threshold amount of data per voxel (e.g., a number of LIDAR data points associated with a voxel) or over a predetermined number of voxels (e.g., a number of LIDAR data points associated with a number of proximate voxels). In some instances, the localization and mapping subsystem 1014 can update a voxel map as data is gathered over time, and/or in response to an autonomous vehicle navigating within the real-world environment to which the voxel space corresponds. For example, the localization and mapping subsystem 1014 may add data and/or discard data from the voxel map as an autonomous vehicle navigates in an environment.

In some instances, the localization and mapping subsystem 1014 can initialize the voxel map, and other voxel space parameters, such as voxel size, orientation, and extent, treating the initial voxel map as representing empty space and the localization and mapping subsystem 1014 can build up representations of objects as LIDAR data is captured over time. In other instances, the localization and mapping subsystem 1014 can initialize the voxel map and voxel space parameters using global map data.

The tracking subsystem 1026 may include functionality to receive an indication of one or more dynamic objects and perform additional processing in order to track the objects. For example, the tracking subsystem 1026 may determine a velocity of a dynamic object and/or may determine and store a trajectory of the dynamic object over time. In some instances, the tracking subsystem 1026 may be programmed to perform a prediction algorithm that may predict a path of the object to be tracked based on previous motion of the object. In various examples, the tracking subsystem 1026 performs data association that one object is the same as a previously detected object. In some examples, the tracking subsystem maintains extents, computes velocities, and determines orientations of object.

The planning subsystem 1028 may include functionality to receive segmented data and/or indications of the ground plane, static objects, and/or dynamic objects to determine a trajectory of an autonomous vehicle. For example, the planning subsystem 1028 may receive segmentation information identifying the ground plane and may generate a trajectory for the autonomous vehicle to follow.

The sensor calibration subsystem 1030 may include functionality to calibrate one or more sensors based at least in part on the segmentation information determined with respect to an environment. For example, while sensor data from the LIDAR subsystem 1004, camera subsystem 1006, radar subsystem 1008, and/or sonar subsystem 1010 may be used to estimate a location and/or orientation (e.g., using simultaneous localization and mapping (SLAM)), an autonomous vehicle may also include additional sensors, such as an inertial measurement unit (IMU) and/or a GPS unit, for determining a location of the autonomous vehicle in an environment. In some instances, the IMU may indicate that the autonomous vehicle is in a first location, while an analysis of the LIDAR data discussed herein indicates that the vehicle is in a second location different from the first location. The sensor calibration subsystem 1030 may determine a difference in the locations and may adjust or calibrate one more sensors to update a location of the autonomous vehicle or one or more sensor intrinsic characteristics or extrinsic characteristics. For example, characteristics of a camera sensor may include focal length, image center, distortion parameters, shutter speed, resolution, and spectrum. Characteristics of a radar may include output power and input sensitivity. Characteristics of a LIDAR sensor may include resolution and sampling rate.

An exemplary neural network might pass input data through a series of connected layers to produce an output. One example of a neural network may include a convolutional neural network, or CNN. Each layer in a CNN may also comprise another CNN, or may comprise a number of layers. As may be understood in the context of this disclosure, a neural network may utilize machine learning, which may refer to a broad class of such algorithms in which an output is generated based on learned parameters.

Although discussed in the context of neural networks, many types of machine learning may be used consistent with this disclosure. For example, machine learning algorithms may include, but are not limited to, regression algorithms (e.g., ordinary least squares regression (OLSR), linear regression, logistic regression, stepwise regression, multivariate adaptive regression splines (MARS), locally estimated scatterplot smoothing (LOESS)), instance-based algorithms (e.g., ridge regression, least absolute shrinkage and selection operator (LASSO), elastic net, least-angle regression (LARS)), decisions tree algorithms (e.g., classification and regression tree (CART), iterative dichotomiser 3 (ID3), Chi-squared automatic interaction detection (CHAID), decision stump, conditional decision trees), Bayesian algorithms (e.g., naïve Bayes, Gaussian naïve Bayes, multinomial naïve Bayes, average one-dependence estimators (AODE), Bayesian belief network (BNN), Bayesian networks), clustering algorithms (e.g., k-means, k-medians, expectation maximization (EM), hierarchical clustering), association rule learning algorithms (e.g., perceptron, back-propagation, Hopfield network, Radial Basis Function Network (RBFN)), deep learning algorithms (e.g., Deep Boltzmann Machine (DBM), Deep Belief Networks (DBN), Convolutional Neural Network (CNN), Stacked Auto-Encoders), dimensionality reduction algorithms (e.g., Principal Component Analysis (PCA), Principal Component Regression (PCR), Partial Least Squares Regression (PLSR), Sammon Mapping, Multidimensional Scaling (MDS), Projection Pursuit, Linear Discriminant Analysis (LDA), Mixture Discriminant Analysis (MDA), Quadratic Discriminant Analysis (QDA), Flexible Discriminant Analysis (FDA)), ensemble algorithms (e.g., Boosting, Bootstrapped Aggregation (Bagging), AdaBoost, Stacked Generalization (blending), Gradient Boosting Machines (GBM), Gradient Boosted Regression Trees (GBRT), Random Forest), SVM (support vector machine), supervised learning, unsupervised learning, semi-supervised learning, etc.

The environment depicted in FIG. 10 might be implemented with one or more computer systems that comprise storage, one or more processor(s), memory, and possibly an operating system.

The systems and methods described herein can be implemented in software or hardware or any combination thereof. The systems and methods described herein can be implemented using one or more computing devices which may or may not be physically or logically separate from each other. The methods may be performed by components arranged as either on-premise hardware, on-premise virtual systems, or hosted-private instances. Additionally, various aspects of the methods described herein may be combined or merged into other functions.

An exemplary environment and computerized system for implementing the systems and methods might include a processor or computer system that can be configured to particularly perform some or all of the methods described herein. In some examples, the methods can be partially or fully automated by one or more computers or processors. The systems and methods described herein may be implemented using a combination of any of hardware, firmware, and/or software. The present systems and methods described herein (or any part(s) or function(s) thereof) may be implemented using hardware, software, firmware, or a combination thereof and may be implemented in one or more computer systems or other processing systems. In some examples, the illustrated system elements could be combined into a single hardware device or separated into multiple hardware devices. If multiple hardware devices are used, the hardware devices could be physically located proximate to or remotely from each other. The examples of the methods described and illustrated are intended to be illustrative and not to be limiting. For example, some or all of the steps of the methods can be combined, rearranged, and/or omitted in different examples.

In one example, the systems and methods described herein may be directed toward one or more computer systems capable of carrying out the functionality described herein. Example computing devices may be, but are not limited to, a personal computer (PC) system running any operating system such as, but not limited to, OS X™, iOS™, Linux™, Android™, and Microsoft™ Windows™. However, the systems and methods described herein may not be limited to these platforms. Instead, the systems and methods described herein may be implemented on any appropriate computer system running any appropriate operating system. Other components of the systems and methods described herein, such as, but not limited to, a computing device, a communications device, mobile phone, a smartphone, a telephony device, a telephone, a personal digital assistant (PDA), a personal computer (PC), a handheld PC, an interactive television (iTV), a digital video recorder (DVD), client workstations, thin clients, thick clients, proxy servers, network communication servers, remote access devices, client computers, server computers, routers, web servers, data, media, audio, video, telephony or streaming technology servers, etc., may also be implemented using a computing device. Services may be provided on demand using, e.g., but not limited to, an interactive television (iTV), a video on demand system (VOD), and via a digital video recorder (DVR), or other on demand viewing system.

The system may include one or more processors. The processor(s) may be connected to a communication infrastructure, such as but not limited to, a communications bus, cross-over bar, or network, etc. The processes and processors need not be located at the same physical locations. In other words, processes can be executed at one or more geographically distant processors over, for example, a LAN or WAN connection. Computing devices may include a display interface that may forward graphics, text, and other data from the communication infrastructure for display on a display unit.

The computer system may also include, but is not limited to, a main memory, random access memory (RAM), and a secondary memory, etc. The secondary memory may include, for example, a hard disk drive and/or a removable storage drive, such as a compact disc drive CD-ROM, etc. The removable storage drive may read from and/or be written to a removable storage unit. As may be appreciated, the removable storage unit may include a computer-usable storage medium having stored therein computer software and/or data. In some examples, a machine-accessible medium may refer to any storage device used for storing data accessible by a computer. Examples of a machine-accessible medium may include, e.g., but are not limited to a magnetic hard disk; a floppy disk; an optical disk, like a compact disc read-only memory (CD-ROM) or a digital versatile disc (DVD); a magnetic tape; and/or a memory chip, etc.

The processor may also include, or be operatively coupled to communicate with, one or more data storage devices for storing data. Such data storage devices can include, as non-limiting examples, magnetic disks (including internal hard disks and removable disks), magneto-optical disks, optical disks, read-only memory, random access memory, and/or flash storage. Storage devices suitable for tangibly embodying computer program instructions and data can also include all forms of non-volatile memory, including, for example, semiconductor memory devices, such as EPROM, EEPROM, and flash memory devices; magnetic disks such as internal hard disks and removable disks; magneto-optical disks; and CD-ROM and DVD-ROM discs. The processor and the memory can be supplemented by, or incorporated in, ASICs (application-specific integrated circuits), or FPGAs (field programmable gate arrays).

The processing system can be in communication with a computerized data storage system. The data storage system can include a non-relational or relational data store, such as a MySQL™ or other relational database. Other physical and logical database types could be used. The data store may be a database server, such as Microsoft SQL Server™, Oracle™, IBM DB2™, SQLITE™, or any other database software, relational or otherwise. The data store may store the information identifying syntactical tags and any information required to operate on syntactical tags. In some examples, the processing system may use object-oriented programming and may store data in objects. In these examples, the processing system may use an object-relational mapper (ORM) to store the data objects in a relational database. The systems and methods described herein can be implemented using any number of physical data models. In one example, a relational database management system (RDBMS) can be used. In those examples, tables in the RDBMS can include columns that represent coordinates. The tables can have pre-defined relationships between them. The tables can also have adjuncts associated with the coordinates.

In alternative examples, secondary memory may include other similar devices for allowing computer programs or other instructions to be loaded into a computer system. Such devices may include, for example, a removable storage unit and an interface. Examples of such may include a program cartridge and cartridge interface (such as, e.g., but not limited to, those found in video game devices), a removable memory chip (such as, e.g., but not limited to, an erasable programmable read-only memory (EPROM), or programmable read-only memory (PROM) and associated socket), and other removable storage units and interfaces, which may allow software and data to be transferred from the removable storage unit to computer system.

The computing device may also include an input device such as, but not limited to, a voice input device, such as a microphone, touch screens, gesture-recognition devices, such as cameras, other natural user interfaces, a mouse or other pointing device such as a digitizer, and a keyboard or other data entry device. The computing device may also include output devices, such as but not limited to, a display, and a display interface. The computing device may include input/output (I/O) devices such as, but not limited to, a communications interface, cable and communications path, etc. These devices may include, but are not limited to, a network interface card, and modems. Communications interface(s) may allow software and data to be transferred between a computer system and one or more external devices.

In one or more examples, the computing device may be operatively coupled to an automotive system. Such automotive system may be either manually operated, semi-autonomous, or fully autonomous. In such an example, input and output devices may include one or more image-capture devices, controllers, microcontrollers, and/or other processors to control automotive functions such as, but not limited to, acceleration, braking, and steering. Further, communication infrastructure in such examples may also include a Controller Area Network (CAN) bus.

In one or more examples, the computing device may be operatively coupled to any machine-based vision system. For example, such machine-based vision systems include but are not limited to manually operated, semi-autonomous, or fully autonomous industrial or agricultural robots, household robots, inspection systems, security systems, etc. That is, the examples described herein are not limited to one particular context and may be applicable to any application utilizing machine vision.

In one or more examples, the present examples can be practiced in the environment of a computer network or networks. The network can include a private network, or a public network (for example the Internet, as described below), or a combination of both. The network may include hardware, software, or a combination of both.

From a telecommunications-oriented view, the network can be described as a set of hardware nodes interconnected by a communications facility, with one or more processes (hardware, software, or a combination thereof) functioning at each such node. The processes can inter-communicate and exchange information with one another via communication pathways between them using interprocess communication pathways. On these pathways, appropriate communications protocols are used. Operational commands (teleoperations) may be received by the system via cellular, infrared, radio, or wireless networking. As a non-limiting example, commands may be generated by a third party system (whether computationally, or as input by a user) in response to a vehicle request for assistance. Such commands may, subsequently, be transmitted to the vehicle and acted upon.

An exemplary computer and/or telecommunications network environment in accordance with the present examples may include nodes, which may include hardware, software, or a combination of hardware and software. The nodes may be interconnected via a communications network. Each node may include one or more processes, executable by processors incorporated into the nodes. A single process may be run by multiple processors, or multiple processes may be run by a single processor, for example. Additionally, each of the nodes may provide an interface point between the network and the outside world, and may incorporate a collection of sub-networks.

In an example, the processes may communicate with one another through interprocess communication pathways supporting communication through any communications protocol. The pathways may function in sequence or in parallel, continuously or intermittently. The pathways can use any of the communications standards, protocols or technologies, described herein with respect to a communications network, in addition to standard parallel instruction sets used by many computers.

The nodes may include any entities capable of performing processing functions. Examples of such nodes that can be used with the examples include computers (such as personal computers, workstations, servers, or mainframes), handheld wireless devices and wireline devices (such as personal digital assistants (PDAs), modem cell phones with processing capability, wireless email devices including BlackBerry™ devices), document-processing devices (such as scanners, printers, facsimile machines, or multifunction document machines), or complex entities (such as local-area networks or wide-area networks) to which are connected a collection of processors, as described. For example, in the context of the present disclosure, a node itself can be a wide-area network (WAN), a local-area network (LAN), a private network (such as a Virtual Private Network (VPN)), or a collection of networks.

Communications between the nodes may be made possible by a communications network. A node may be connected either continuously or intermittently with communications network. As an example, in the context of the present disclosure, a communications network can be a digital communications infrastructure providing adequate bandwidth and information security.

The communications network can include wireline communications capability, wireless communications capability, or a combination of both, at any frequencies, using any type of standard, protocol or technology. In addition, in the present examples, the communications network can be a private network (for example, a VPN) or a public network (for example, the Internet).

Anon-inclusive list of exemplary wireless protocols and technologies used by a communications network may include Bluetooth™, general packet radio service (GPRS), cellular digital packet data (CDPD), mobile solutions platform (MSP), multimedia messaging (MIMS), wireless application protocol (WAP), code division multiple access (CDMA), short message service (SMS), wireless markup language (WML), handheld device markup language (HDML), binary runtime environment for wireless (BREW), radio access network (RAN), and packet switched core networks (PS-CN). Also included are various generation wireless technologies. An exemplary non-inclusive list of primarily wireline protocols and technologies used by a communications network includes asynchronous transfer mode (ATM), enhanced interior gateway routing protocol (EIGRP), frame relay (FR), high-level data link control (HDLC), Internet control message protocol (ICMP), interior gateway routing protocol (IGRP), internetwork packet exchange (IPX), ISDN, point-to-point protocol (PPP), transmission control protocol/internet protocol (TCP/IP), routing information protocol (RIP) and user datagram protocol (UDP). As skilled persons will recognize, any other known or anticipated wireless or wireline protocols and technologies can be used.

Examples of the present disclosure may include apparatuses for performing the operations herein. An apparatus may be specially constructed for the desired purposes, or it may comprise a general-purpose device selectively activated or reconfigured by a program stored in the device.

In one or more examples, the present examples are embodied in machine-executable instructions. The instructions can be used to cause a processing device, for example a general-purpose or special-purpose processor, which is programmed with the instructions, to perform the steps of the present disclosure. Alternatively, the steps of the present disclosure can be performed by specific hardware components that contain hardwired logic for performing the steps, or by any combination of programmed computer components and custom hardware components. For example, the present disclosure can be provided as a computer program product, as outlined above. In this environment, the examples can include a machine-readable medium having instructions stored on it. The instructions can be used to program any processor or processors (or other electronic devices) to perform a process or method according to the present examples. In addition, the present disclosure can also be downloaded and stored on a computer program product. Here, the program can be transferred from a remote computer (e.g., a server) to a requesting computer (e.g., a client) by way of data signals embodied in a carrier wave or other propagation medium via a communication link (e.g., a modem or network connection) and ultimately such signals may be stored on the computer systems for subsequent execution.

The methods can be implemented in a computer program product accessible from a computer-usable or computer-readable storage medium that provides program code for use by or in connection with a computer or any instruction execution system. A computer-usable or computer-readable storage medium can be any apparatus that can contain or store the program for use by or in connection with the computer or instruction execution system, apparatus, or device.

A data processing system suitable for storing and/or executing the corresponding program code can include at least one processor coupled directly or indirectly to computerized data storage devices such as memory elements. Input/output (I/O) devices (including but not limited to keyboards, displays, pointing devices, etc.) can be coupled to the system. Network adapters may also be coupled to the system to enable the data processing system to become coupled to other data processing systems or remote printers or storage devices through intervening private or public networks. To provide for interaction with a user, the features can be implemented on a computer with a display device, such as an LCD (liquid crystal display), or another type of monitor for displaying information to the user, and a keyboard and an input device, such as a mouse or trackball by which the user can provide input to the computer.

A computer program can be a set of instructions that can be used, directly or indirectly, in a computer. The systems and methods described herein can be implemented using programming languages such as CUDA, OpenCL, Flash™, JAVA™, C++, C, C#, Python, Visual Basic™, JavaScript™ PHP, XML, HTML, etc., or a combination of programming languages, including compiled or interpreted languages, and can be deployed in any form, including as a stand-alone program or as a subsystem, component, subroutine, or other unit suitable for use in a computing environment. The software can include, but is not limited to, firmware, resident software, microcode, etc. Protocols such as SOAP/HTTP may be used in implementing interfaces between programming subsystems. The components and functionality described herein may be implemented on any desktop operating system executing in a virtualized or non-virtualized environment, using any programming language suitable for software development, including, but not limited to, different versions of Microsoft Windows™, Apple™ Mac™, iOS™, Unix™/X-Windows™, Linux™, VMS™, Android, QNX, etc. The system could be implemented using a web application framework, such as Ruby on Rails.

Suitable processors for the execution of a program of instructions include, but are not limited to, general and special purpose microprocessors, and the sole processor or one of multiple processors or cores, of any kind of computer. A processor may receive and store instructions and data from a computerized data storage device such as a read-only memory, a random access memory, both, or any combination of the data storage devices described herein. A processor may include any processing circuitry or control circuitry operative to control the operations and performance of an electronic device.

The systems, subsystems, and methods described herein can be implemented using any combination of software or hardware elements. The systems, subsystems, and methods described herein can be implemented using one or more virtual machines operating alone or in combination with one other. Any applicable virtualization solution can be used for encapsulating a physical computing machine platform into a virtual machine that is executed under the control of virtualization software running on a hardware computing platform or host. The virtual machine can have both virtual system hardware and guest operating system software.

The systems and methods described herein can be implemented in a computer system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include, e.g., a LAN, a WAN, and the computers and networks that form the Internet.

One or more examples of the present disclosure may be practiced with other computer system configurations, including hand-held devices, microprocessor systems, microprocessor-based or programmable consumer electronics, minicomputers, mainframe computers, etc. The systems and methods described herein may also be practiced in distributed computing environments where tasks are performed by remote processing devices that are linked through a network.

The terms "computer program medium" and "computer readable medium" may be used to generally refer to media such as but not limited to removable storage drive, a hard disk installed in a hard disk drive. These computer program products may provide software to computer systems. The systems and methods described herein may be directed to such computer program products.

References to "one embodiment," "an embodiment," "example embodiment," "various embodiments," etc., may indicate that the embodiment(s) of the present disclosure may include a particular feature, structure, or characteristic, but not every embodiment necessarily includes the particular feature, structure, or characteristic. Further, repeated use of the phrases "in one embodiment," or "in an exemplary embodiment," do not necessarily refer to the same embodiment, although they may. Similarly, references to "instances" may indicate that various instance(s) of the present disclosure may include a particular feature, structure, or characteristic, but not every instance necessarily includes the particular feature, structure, or characteristic. Further, repeated use of the phrase "in some instances" does not necessarily refer to the same instance, although it may.

An algorithm may generally be considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

Unless specifically stated otherwise, it may be appreciated that throughout the specification terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

In a similar manner, the term "processor" may refer to any device or portion of a device that processes electronic data from registers and/or memory and transform that electronic data into other electronic data that may be stored in registers and/or memory. As non-limiting examples, "processor" may be a Central Processing Unit (CPU) or a Graphics Processing Unit (GPU). A "computing platform" may comprise one or more processors. As used herein, "software" processes may include, for example, software and/or hardware entities that perform work over time, such as tasks, threads, and intelligent agents. Also, each process may refer to multiple processes, for carrying out instructions in sequence or in parallel, continuously or intermittently. The terms "system" and "method" are used herein interchangeably insofar as the system may embody one or more methods and the methods may be considered a system.

In the present document, references may be made to obtaining, acquiring, receiving, or inputting analog or digital data into a subsystem, computer system, or computer-implemented machine. The process of obtaining, acquiring, receiving, or inputting analog and digital data can be accomplished in a variety of ways such as by receiving the data as a parameter of a function call or a call to an application programming interface. In some implementations, the process of obtaining, acquiring, receiving, or inputting analog or digital data can be accomplished by transferring the data via a serial or parallel interface. In another implementation, the process of obtaining, acquiring, receiving, or inputting analog or digital data can be accomplished by transferring the data via a computer network from the providing entity to the acquiring entity. References may also be made to providing, outputting, transmitting, sending, or presenting analog or digital data. In various examples, the process of providing, outputting, transmitting, sending, or presenting analog or digital data can be accomplished by transferring the data as an input or output parameter of a function call, a parameter of an application programming interface or interprocess communication mechanism.

While one or more embodiments have been described, various alterations, additions, permutations and equivalents thereof are included within the scope of the disclosure.

In the description of embodiments, reference is made to the accompanying drawings that form a part hereof, which show by way of illustration specific embodiments of the claimed subject matter. It is to be understood that other embodiments may be used and that changes or alterations, such as structural changes, may be made. Such embodiments, changes or alterations are not necessarily departures from the scope with respect to the intended claimed subject matter. While the steps herein may be presented in a certain order, in some cases the ordering may be changed so that certain inputs are provided at different times or in a different order without changing the function of the systems and methods described. The disclosed procedures could also be executed in different orders. Additionally, various computations that are herein need not be performed in the order disclosed, and other embodiments using alternative orderings of the computations could be readily implemented. In addition to being reordered, the computations could also be decomposed into sub-computations with the same results. In some examples, operations shown may be performed in parallel and substantially simultaneously. In general, although a sequence of blocks may be shown, not all steps may be required to perform the process shown.

Although the discussion above sets forth example implementations of the described techniques, other architectures may be used to implement the described functionality, and are intended to be within the scope of this disclosure. Furthermore, although specific distributions of responsibilities are defined above for purposes of discussion, the various functions and responsibilities might be distributed and divided in different ways, depending on circumstances.

Furthermore, although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

Example Clauses

Embodiments of the disclosure can be described in view of the following clauses:

1. A method, comprising determining a plurality of object parameter sets; generating a plurality of vegetation object models based at least in part on the object parameter sets, an individual vegetation object model of the plurality of vegetation object models generated from an individual object parameter set of the plurality of object parameter sets; generating, for a vegetation object model of the plurality of vegetation object model, a plurality of simulated sensor return signals in a simulated environment; training a machine learned model based at least in part on the plurality of simulated sensor return signals, an output of the machine learned model comprising a predicted set of parameters; receiving, from a sensor, sensor data associated with vegetation in an environment; inputting the sensor data into the machine learned model; receiving an object parameter set based at least in part on the machine learned model; generating, based at least in part on the object parameter set, a simulated vegetation object model; and generating a simulation of the environment comprising the simulated vegetation object model.

2. The method of clause 1, wherein: the plurality of simulated sensor return signals are generated by simulating sensor returns of the vegetation object models; and the machine learned model is trained based at least in part on the object parameter sets and the simulated sensor return signals.

3. The method of clause 1 or 2, further comprising: obtaining a command signal directed to a simulated vehicle in the simulation; and modify a location of the simulated vehicle based at least in part on the command signal.

4. The method of any of clause 1 to 3, wherein: the vegetation comprises a tree; and the object parameter set specifies a tree height, a trunk width, a vegetation color, and a branch structure for the tree.

5. A system, comprising: one or more processors; memory that stores computer-executable instructions that, if executed, cause the one or more processors to: generate a plurality of object models based at least in part on a plurality of object parameter sets; generate a plurality of sensor return signals based at least in part on the plurality of object models; train a machine learned model based at least in part on the plurality of sensor return signals, an output of the machine learned model comprising a simulation parameter set; and determine parameters for a simulated object, the parameters based at least in part on sensor data and the machine learned model.

6. The system of clause 5, wherein the computer-executable instructions further include instructions that, if executed, cause the one or more processors to: provide the parameters for the simulated object to an object generator; and obtain, from the object generator, an object model that conforms to the parameters for the simulated object.

7. The system of clause 6, wherein: the parameters for the simulated object specify an object type; the object generator is selected from a plurality of object generators based on the object type; and the object model is of the object type.

8. The system of any of clause 5 to 7, wherein the sensor data includes image data, a radar data, or a LIDAR data comprising a real-world object.

9. The system of any of clause 5 to 8, wherein: a parameter set in the plurality of object parameter sets includes a number of parameter dimensions; and the plurality of object parameter sets is generated by varying a parameter dimension in an individual parameter set over a range of values.

10. The system of any of clause 5 to 9, wherein the machine learned model comprises a neural network, logistic regression, linear discriminant analysis, classification regression trees, Naive Bayes, K-Nearest Neighbors, learning vector quantization, support vector machines, random forest, boosting algorithm, k-means clustering algorithm, or k-median clustering algorithm.

11. The system of any of clause 5 to 10, wherein: an object model of the plurality of object models is determined based at least in part on an object parameter set of the plurality of object parameter sets; the object model is used to generate a first plurality of sensor return signals in the plurality of sensor return signals; and the machine learned model is trained using a relationship between the individual parameter set and the individual sensor return signal.

12. The system of clause 11, wherein individual sensor return signals of the first plurality of sensor return signals are collected with different viewing angles, viewing distances, and lighting conditions.

13. One or more non-transitory computer-readable storage media having stored thereon executable instructions that, as a result of being executed by one or more processors of a computer system, cause the computer system to at least: generate a plurality of object parameter sets; obtain, based at least in part on the plurality of object parameter sets, a plurality of object models; generate a plurality of simulated sensor return signals by generating a sensor return value for individual object models in the plurality of object models; configure a machine learned model using the plurality of simulated sensor return signals and the plurality of object parameter sets, an output of the machine learned model comprising a parameter set that produces an object from an input of a desired sensor return signal; and obtain parameters for a simulated object, the parameters based at least in part on the machine learned model and sensor data.

14. The one or more non-transitory computer-readable storage media of clause 13, wherein: the sensor data is sensor return data from a real-world object; and the simulated object, when observed by a simulated sensor, results in a simulated sensor return that resembles the sensor data.

15. The one or more non-transitory computer-readable storage media of clause 13 or 14, wherein the executable instructions further cause the computer system to: generate a simulated environment that includes the simulated object, the simulated environment including a simulated vehicle; obtain a simulated sensor value from the simulated vehicle; and modify a state of the simulated vehicle based at least in part on the simulated sensor value.

16. The one or more non-transitory computer-readable storage media of clause 15, wherein the executable instructions further cause the computer system to: obtain a command from a vehicle control system; and modify a state of the simulated vehicle in accordance with the command.

17. The non-transitory computer-readable storage medium of clause 15 or 16, wherein the simulated object represents a tree, rock, building, or vehicle.

18. The non-transitory computer-readable storage medium of any of clause 13 to 17, wherein the executable instructions further cause the computer system to: generate a simulated signal projected from a simulated sensor; and determine a simulated sensor return signal based at least in part on a rendering of the simulated object.

19. The non-transitory computer-readable storage medium of any of clause 13 to 18, wherein the executable instructions further cause the computer system to: obtain sensor data associated with a real-world object; and identify, based on the sensor data, an object type for the real-world object.

20. The non-transitory computer-readable storage medium of clause 19, wherein the instructions further cause the computer system to: select an object generator from a plurality of object generators based at least in part on the object type; generate the parameters for the simulated object based at least in part on the object generator selected; and provide the parameters for the simulated object to the object generator.

What is claimed is:

1. A method, comprising:
receiving, from a sensor, sensor data associated with vegetation in an environment;
inputting the sensor data into a trained machine learned model;
receiving an object parameter set based at least in part on the machine learned model; and
generating, based at least in part on the object parameter set, a simulated vegetation object model;
wherein the machine learned model is trained based at least in part on:
determining a plurality of object parameter sets;
generating a plurality of vegetation object models based at least in part on the object parameter sets, an individual vegetation object model of the plurality of vegetation object models generated from an individual object parameter set of the plurality of object parameter sets;
generating, for a vegetation object model of the plurality of vegetation object model, a plurality of simulated sensor return signals by simulating sensor returns of the vegetation object model in a simulated environment; and
training the machine learned model based at least in part on the plurality of simulated sensor return signals and the object parameter set associated with the vegetation object model, an output of the machine learned model comprising a predicted set of parameters.

2. The method of claim 1, further comprising:
obtaining a command signal directed to a simulated vehicle in a simulation; and
modifying a location of the simulated vehicle based at least in part on the command signal.

3. The method of claim 1, wherein:
the vegetation comprises a tree; and
the object parameter set specifies a tree height, a trunk width, a vegetation color, and a branch structure for the tree.

4. A system, comprising:
one or more processors; and
memory that stores computer-executable instructions that, if executed, cause the one or more processors to:
receive sensor data from a sensor of the system;
input the sensor data into a machine learned model trained to output object parameters, the machine learned model trained, at least in part, on a plurality of simulated sensor return signals generated by simulating sensor returns of object models in a simulated environment, wherein each object model is simulated based on an object parameter set associated with the object model;
receive, from the machine learned model, parameters for a simulated object, wherein the parameters specify an object type;
provide the parameters for the simulated object to an object generator, wherein the object generator is selected from a plurality of object generators based on the object type; and
obtain, from the object generator, an object model of the object type that conforms to the parameters for the simulated object.

5. The system of claim 4, wherein the machine learned model is trained, based at least in part on:
generating a plurality of object models based at least in part on a plurality of object parameter sets;
generating a plurality of sensor return signals based at least in part on the plurality of object models; and
training the machine learned model based at least in part on the plurality of sensor return signals and the plurality of object parameter sets.

6. The system of claim 4, wherein the sensor data includes image data, a radar data, or a LIDAR data comprising a real-world object.

7. The system of claim 5, wherein:
a parameter set in the plurality of object parameter sets includes a number of parameter dimensions; and
the plurality of object parameter sets is generated by varying a parameter dimension in an individual parameter set over a range of values.

8. The system of claim 4, wherein the machine learned model comprises a neural network, logistic regression, linear discriminant analysis, classification regression trees, Naive Bayes, K-Nearest Neighbors, learning vector quantization, support vector machines, random forest, boosting algorithm, k-means clustering algorithm, or k-median clustering algorithm.

9. The system of claim 5, wherein:
an object model of the plurality of object models is determined based at least in part on an individual parameter set of the plurality of object parameter sets;
the object model is used to generate a first plurality of sensor return signals in the plurality of sensor return signals; and
the machine learned model is trained using a relationship between the individual parameter set and an individual sensor return signal of the plurality of sensor return signals.

10. The system of claim 9, wherein individual sensor return signals of the first plurality of sensor return signals are collected with different viewing angles, viewing distances, and lighting conditions.

11. One or more non-transitory computer-readable storage media having stored thereon executable instructions that, as a result of being executed by one or more processors of a computer system, cause the computer system to at least:
receive sensor data from a sensor;
input the sensor data into a machine learned model, the model trained to output a parameter set based at least in part on the input; and
obtain parameters for a simulated object, the parameters based at least in part on the machine learned model and sensor data;
wherein the machine learned model is trained by:
generating a plurality of object parameter sets;
generating, based at least in part on the plurality of object parameter sets, a plurality of object models;
generating a plurality of simulated sensor return signals by generating a plurality of simulated sensor data from a plurality of simulated sensors for individual object model in the plurality of object models, wherein the plurality of object models include one or more of a rendering or a raycasting of the simulated object; and
training the machine learned model using the plurality of simulated sensor data and the plurality of object parameter sets.

12. The one or more non-transitory computer-readable storage media of claim 11, wherein:
the sensor data is sensor return data from a real-world object; and
the simulated object, when observed by a simulated sensor, results in a simulated sensor return that resembles the sensor data.

13. The one or more non-transitory computer-readable storage media of claim 11, wherein the executable instructions further cause the computer system to:
generate a simulated environment that includes the simulated object, the simulated environment including a simulated vehicle;
obtain a simulated sensor value from the simulated vehicle; and
modify a state of the simulated vehicle based at least in part on the simulated sensor value.

14. The one or more non-transitory computer-readable storage media of claim 13, wherein the executable instructions further cause the computer system to:
obtain a command from a vehicle control system; and
modify a state of the simulated vehicle in accordance with the command.

15. The one or more non-transitory computer-readable storage medium of claim 13, wherein the simulated object represents a tree, rock, building, or vehicle.

16. The one or more non-transitory computer-readable storage medium of claim 11, wherein the executable instructions further cause the computer system to:
obtain sensor data associated with a real-world object; and
identify, based on the sensor data, an object type for the real-world object.

17. The one or more non-transitory computer-readable storage medium of claim 16, wherein the executable instructions further cause the computer system to:
select an object generator from a plurality of object generators based at least in part on the object type;
generate the parameters for the simulated object based at least in part on the object generator selected; and
provide the parameters for the simulated object to the object generator.

* * * * *